US009423685B2

United States Patent
Shoki et al.

(10) Patent No.: US 9,423,685 B2
(45) Date of Patent: Aug. 23, 2016

(54) MULTILAYER REFLECTIVE FILM FORMED SUBSTRATE, REFLECTIVE MASK BLANK, MASK BLANK, METHODS OF MANUFACTURING THE SAME, REFLECTIVE MASK, AND MASK

(71) Applicant: HOYA CORPORATION, Shinjuku-ku, Tokyo (JP)

(72) Inventors: Tsutomu Shoki, Shinjuku-ku (JP); Kazuhiro Hamamoto, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 185 days.

(21) Appl. No.: 14/355,477

(22) PCT Filed: Feb. 5, 2013

(86) PCT No.: PCT/JP2013/052599
§ 371 (c)(1),
(2) Date: Apr. 30, 2014

(87) PCT Pub. No.: WO2013/118716
PCT Pub. Date: Aug. 15, 2013

(65) Prior Publication Data
US 2014/0302429 A1 Oct. 9, 2014

(30) Foreign Application Priority Data

Feb. 10, 2012 (JP) .................................. 2012-027638
Dec. 30, 2012 (JP) .................................. 2012-289264

(51) Int. Cl.
*G03F 1/24* (2012.01)
*G03F 1/44* (2012.01)

(52) U.S. Cl.
CPC ... *G03F 1/24* (2013.01); *G03F 1/44* (2013.01)

(58) Field of Classification Search
CPC ..................................... G03F 1/24; G03F 1/44
USPC .................................................................. 430/5
See application file for complete search history.

(56) References Cited

U.S. PATENT DOCUMENTS

2003/0184721 A1 10/2003 Itoh

FOREIGN PATENT DOCUMENTS

| JP | 2003-248299 A | 9/2003 |
| JP | 2004-170948 A | 6/2004 |
| JP | 2009-251412 A | 10/2009 |
| JP | 2010-272553 A | 12/2010 |
| WO | 2008/129914 A1 | 10/2008 |

OTHER PUBLICATIONS

International Search Report of PCT/JP2013/052599, dated May 14, 2013.

*Primary Examiner* — Stephen Rosasco
(74) *Attorney, Agent, or Firm* — Sughrue Mion, PLLC

(57) ABSTRACT

Provided is a multilayer reflective film formed substrate formed with a fiducial mark for accurately managing coordinates of defects. A multilayer reflective film formed substrate is formed with a multilayer reflective film, which is adapted to reflect EUV light, on a substrate and a fiducial mark which serves as a reference for a defect position in defect information is formed on the multilayer reflective film. The fiducial mark includes a main mark for determining a reference point for the defect position and auxiliary marks arranged around the main mark. The main mark has a point-symmetrical shape and has a portion with a width of 200 nm or more and 10 μm or less with respect to a scanning direction of an electron beam writing apparatus or defect inspection light.

24 Claims, 8 Drawing Sheets

MULTILAYER REFLECTIVE FILM FORMED SUBSTRATE, REFLECTIVE MASK BLANK, MASK BLANK, METHODS OF MANUFACTURING THE SAME, REFLECTIVE MASK, AND MASK

CROSS REFERENCE TO RELATED APPLICATIONS

This application is a National Stage of International Application No. PCT/JP2013/052599 filed Feb. 5, 2013, claiming priority based on Japanese Patent Application Nos. 2012-027638, filed Feb. 10, 2012 and 2012-289264, filed Dec. 30, 2012, the contents of all of which are incorporated herein by reference in their entirety.

TECHNICAL FIELD

This invention relates to a multilayer reflective film formed substrate, a reflective mask blank, a reflective mask, a mask blank, and a mask which are for use in the manufacture of semiconductor devices or the like, and further to a method of manufacturing the multilayer reflective film formed substrate, a method of manufacturing the reflective mask blank, and a method of manufacturing the mask blank.

BACKGROUND ART

Generally, fine pattern formation is carried out by the photolithography in manufacturing processes of a semiconductor device. A number of transfer masks called photomasks are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film or the like) for forming a transfer pattern (mask pattern) on a transparent substrate such as a glass substrate. The manufacture of the transfer mask using the mask blank comprises a writing process of writing a required pattern on a resist film formed on the mask blank, a developing process of, after the writing, developing the resist film to form a required resist pattern, an etching process of etching the thin film using this resist pattern as a mask, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using this resist pattern as a mask, an exposed portion of the thin film, where the resist pattern is not formed, is removed by dry etching or wet etching, thereby forming a required mask pattern on the transparent substrate. In this manner, the transfer mask is completed.

As a type of transfer mask, a phase shift mask is known apart from a conventional binary mask having a light-shielding film pattern made of a chromium-based material on a transparent substrate. This phase shift mask is configured to have a phase shift film on a transparent substrate. This phase shift film is adapted to provide a predetermined phase difference and is made of, for example, a material containing a molybdenum silicide compound or the like. Further, use has also been made of a binary mask using, as a light-shielding film, a material containing a metal silicide compound such as a molybdenum silicide compound.

In recent years, with higher integration of semiconductor devices, patterns finer than the transfer limit of the photolithography using the conventional ultraviolet light have been required in the semiconductor industry. In order to enable formation of such fine patterns, the EUV lithography being an exposure technique using extreme ultraviolet (Extreme Ultra Violet: hereinafter referred to as "EUV") light is expected to be promising. Herein, the EUV light represents light in a wavelength band of the soft X-ray region or the vacuum ultraviolet region and, specifically, light having a wavelength of about 0.2 to 100 nm. A reflective mask has been proposed as a mask for use in the EUV lithography. In the reflective mask, a multilayer reflective film for reflecting exposure light is formed on a substrate and an absorber film for absorbing exposure light is formed in a pattern on the multilayer reflective film.

With the increasing demand for miniaturization in the lithography process as described above, problems in the lithography process are becoming remarkable. One of them is a problem about defect information of a substrate for a mask blank or the like for use in the lithography process.

Conventionally, taking the center of a substrate as the origin (0,0), the existing position of a defect of the substrate is specified by the distance from the origin (0,0) in mask blank inspection or the like. As a consequence, the position accuracy is low and there is variation in detection among apparatuses and thus, when patterning a pattern-formation thin film while avoiding the defect at the time of pattern writing, it is difficult to avoid it on the order of $\mu$m. Therefore, the defect is avoided by changing the direction of pattern transfer or roughly shifting the pattern transfer position on the order of mm.

Under these circumstances, for the purpose of enhancing the inspection accuracy of a defect position, there has been a proposal, for example, to form a fiducial mark on a substrate for a mask blank and to specify a position of a defect using the fiducial mark as a reference position.

Patent Document 1 discloses that, in order to accurately specify a position of a minute defect having a sphere-equivalent diameter of about 30 nm, at least three marks each having a sphere-equivalent diameter of 30 to 100 nm are formed on a film-forming surface of a substrate for a reflective mask blank for EUV lithography.

PRIOR ART DOCUMENT

Patent Document

Patent Document 1: WO2008/129914

SUMMARY OF THE INVENTION

Problem to be Solved by the Invention

It is theoretically possible to enhance the inspection accuracy of a defect position of a mask blank by the method disclosed in Patent Document 1. However, since the size of the mark is as small as 30 to 100 nm in terms of sphere-equivalent diameter, there is a problem, for example, that it is difficult to detect the mark by a usually used defect inspection apparatus or the like and that the detection reproducibility is poor, so that a reference position for specifying a defect position is difficult to determine. Patent Document 1 discloses forming auxiliary marks around the mark for identifying this mark. However, even if the position where the mark is formed can be roughly specified using these auxiliary marks, the presence of the mark itself cannot be easily recognized without using a special inspection apparatus with extremely high detection accuracy and thus it is difficult to specify an exact reference point.

Recently, there has been proposed an attempt to correct writing data based on defect data of a mask blank and device pattern data so that an absorber pattern is formed at a portion where a defect is present, thereby carrying out defect mitigation (Defect mitigation technology). In order to achieve this technology, a fiducial mark is detected also by an electron beam of an electron beam writing apparatus in a state of a resist film formed mask blank in which an absorber film is formed on a multilayer reflective film and further a resist film for forming an absorber pattern is formed, and then, based on a detected reference point, electron beam writing is carried out according to corrected/modified writing data. Thus, a certain contrast is required for electron beam scanning with respect also to the fiducial mark. In the case of the mark with the size disclosed in Patent Document 1, there is a problem that the contrast for electron beam scanning cannot be sufficiently obtained.

In order to form a fiducial mark on a substrate for a mask blank or the like and to manage (coordinately manage) relative positions between this fiducial mark and a defect with high accuracy, it is required that the fiducial mark be easily detected, i.e. be surely detected, and further that variation in defect detection position based on the fiducial mark be small (e.g. in order to achieve the Defect mitigation technology described above, variation in defect detection position when the fiducial mark is used as a reference point should be 100 nm or less). However, the conventional technique disclosed in Patent Document 1 or the like is still insufficient for satisfying such a requirement.

Therefore, this invention has been made in view of such conventional problems and its object is, first, to provide a multilayer reflective film formed substrate, a reflective mask blank, and a mask blank each formed with a fiducial mark for accurately managing coordinates of a defect, second, to provide a reflective mask and a mask each using the mask blank or the like and reduced in defects, and, third, to provide a multilayer reflective film formed substrate manufacturing method, a reflective mask blank manufacturing method, and a mask blank manufacturing method, which each correlate a multilayer reflective film formed substrate, a reflective mask blank, or a mask blank having a fiducial mark which is formed on an edge basis or having a fiducial mark which is formed and then a formation position of which is specified by a coordinate measuring apparatus and formation position information of the fiducial mark with each other.

Means for Solving the Problem

In order to solve the above-mentioned problems, the present inventors have paid attention particularly to the size and shape of a fiducial mark and, as a result of intensive studies, have found that if a fiducial mark comprising a main mark having a point-symmetrical shape and a size in a specific range and auxiliary marks arranged around the main mark is formed, it is possible to surely detect the fiducial mark by either an electron beam writing apparatus or an optical defect inspection apparatus regardless of the apparatus and further the offset of a reference point for a defect position, which is determined by scanning with an electron beam or defect inspection light, can be made small so that variation in defect detection position inspected based on the fiducial mark can be suppressed to 100 nm or less. Further, the present inventors have also found that if a fiducial mark is formed on an edge basis or if a fiducial mark is formed at an arbitrary position and then a formation position of the fiducial mark is specified by a coordinate measuring apparatus, the size of the fiducial mark can be made smaller and, in that case, the fiducial mark may consist of only a main mark.

As a result of further intensive studies based on the elucidated fact described above, the present inventors have completed this invention.

Specifically, in order to solve the above-mentioned problems, this invention has the following structures.

(Structure 1)

A multilayer reflective film formed substrate, comprising a substrate; a multilayer reflective film which is formed on the substrate and which reflects EUV light; and a fiducial mark which serves as a reference for a defect position in defect information; wherein the fiducial mark comprises a main mark for determining a reference point for the defect position, and wherein the main mark has a point-symmetrical shape and has a portion with a width of 200 nm or more and 10 μm or less with respect to a scanning direction of an electron beam or defect inspection light.

As recited in Structure 1, the multilayer reflective film formed substrate according to this invention is formed with the fiducial mark which serves as the reference for the defect position in the defect information and this fiducial mark comprises the main mark for determining the reference point for the defect position. This main mark has the point-symmetrical shape and has the portion with the width of 200 nm or more and 10 μm or less with respect to the scanning direction of the electron beam or the defect inspection light. The fiducial mark thus configured can be easily detected, i.e. can be surely detected, by either an electron beam writing apparatus or an optical, EUV light, or electron beam defect inspection apparatus. Further, since the main mark has the point-symmetrical shape, the offset of the reference point, which is determined by scanning with the electron beam or the defect inspection light, can be made small. If the fiducial mark is formed on an edge basis or if the fiducial mark is formed at an arbitrary position and then a formation position of the fiducial mark is specified by a coordinate measuring apparatus, the size of the fiducial mark can be made smaller and, in that case, the fiducial mark may consist of only the main mark. When the size of the fiducial mark can be reduced as described above, if, for example, FIB (focused ion beam) is used as a fiducial mark forming means, the processing time can be shortened, and further, the fiducial mark detection time can also be shortened. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

(Structure 2)

A multilayer reflective film formed substrate, comprising a substrate; a multilayer reflective film which is formed on the substrate and which reflects EUV light; and a fiducial mark which serves as a reference for a defect position in defect information; wherein the fiducial mark comprises a main mark for determining a reference point for the defect position and an auxiliary mark arranged around the main mark, and wherein the main mark has a point-symmetrical shape and has a portion with a width of 200 nm or more and 10 µm or less with respect to a scanning direction of an electron beam or defect inspection light.

As recited in Structure 2, the multilayer reflective film formed substrate according to this invention is formed with the fiducial mark which serves as the reference for the defect position in the defect information and this fiducial mark comprises the main mark for determining the reference point for the defect position and the auxiliary mark arranged around the main mark. This main mark has the point-symmetrical shape and has the portion with the width of 200 nm or more and 10 µm or less with respect to the scanning direction of the electron beam or the defect inspection light. The fiducial mark thus configured can be easily detected, i.e. can be surely detected, by either an electron beam writing apparatus or an optical defect inspection apparatus. Further, since the main mark has the point-symmetrical shape, the offset of the reference point, which is determined by scanning with the electron beam or the defect inspection light, can be made small. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

(Structure 3)

The multilayer reflective film formed substrate according to Structure 1 or 2, wherein the main mark has a polygonal shape having at least two pairs of sides each perpendicular to and parallel to scanning directions of the electron beam or the defect inspection light.

As recited in Structure 3, since the main mark has the polygonal shape (e.g. square shape, octagonal shape, or the like) having at least two pairs of sides each perpendicular to and parallel to the scanning directions of the electron beam writing apparatus or the defect inspection light, it is possible to improve ease (reliability) of detection by the electron beam writing apparatus or the defect inspection apparatus and to further suppress variation in defect detection position.

(Structure 4)

The multilayer reflective film formed substrate according to any of Structures 1 to 3, wherein the auxiliary mark has a rectangular shape with long sides perpendicular to and short sides parallel to the scanning direction of the electron beam or the defect inspection light.

As recited in Structure 4, since the auxiliary mark has the rectangular shape with the long sides perpendicular to and the short sides parallel to the scanning direction of the electron beam or the defect inspection light, it can be surely detected by scanning with the electron beam writing apparatus or the defect inspection apparatus so that a position of the main mark can be easily specified.

(Structure 5)

The multilayer reflective film formed substrate according to any of Structures 1 to 4, wherein the multilayer reflective film is formed with the fiducial mark.

As recited in Structure 5, since the multilayer reflective film of the multilayer reflective film formed substrate is formed with the fiducial mark, the fiducial mark can be easily detected by scanning with the electron beam or the defect inspection light in defect inspection after the formation of the multilayer reflective film. Further, it is also possible to recycle (reuse) a glass substrate by stripping and removing the multilayer reflective film without discarding the multilayer reflective film formed substrate in which a defect which cannot be avoided even by correction/modification of writing data or the like is discovered in the multilayer reflective film.

(Structure 6)

A reflective mask blank, wherein an absorber film for absorbing the EUV light is formed on the multilayer reflective film of the multilayer reflective film formed substrate according to any of Structures 1 to 5.

Since the absorber film to be a transfer pattern, which is adapted to absorb the EUV light, is formed on the multilayer reflective film of the multilayer reflective film formed substrate with the above-mentioned structure, there is obtained the reflective mask blank formed with the fiducial mark which serves as the reference for the defect position in the defect information.

(Structure 7)

A reflective mask blank, comprising a substrate; a multilayer reflective film which formed on the substrate and which reflects EUV light; an absorber film which is formed on the multilayer reflective film and which absorbs the EUV light; and a fiducial mark which serves as a reference for a defect position in defect information; wherein the fiducial mark comprises a main mark for determining a reference point for the defect position, and wherein the main mark has a point-symmetrical shape and has a portion with a width of 200 nm or more and 10 µm or less with respect to a scanning direction of an electron beam or defect inspection light.

As recited in Structure 7, the reflective mask blank according to this invention has the absorber film formed with the fiducial mark which serves as the reference for the defect position in the defect information and this fiducial mark comprises the main mark for determining the reference point for the defect position. This main mark has the point-symmetrical shape and has the portion with the width of 200 nm or more and 10 µm or less with respect to the scanning direction of the electron beam or the defect inspection light. The fiducial mark thus configured can be easily detected, i.e. can be surely detected, by either an electron beam writing apparatus or an optical, EUV light, or electron beam defect inspection apparatus. Further, since the main mark has the point-symmetrical shape, the offset of the reference point, which is determined by scanning with the electron beam or the defect inspection light, can be made small. If the fiducial mark is formed on an edge basis or if the fiducial mark is formed at an arbitrary position and then a formation position of the fiducial mark is specified by a coordinate measuring apparatus, the size of the fiducial mark can be made smaller and, in that case, the fiducial mark may consist of only the main mark. When the size of the fiducial mark can be reduced as described above, if, for example, FIB (focused ion beam) is used as a fiducial mark forming means, the processing time can be shortened, and further, the fiducial mark detection time can also be shortened. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

(Structure 8)

The reflective mask blank according to Structure 7, wherein the absorber film is formed with the fiducial mark.

Structure 8 provides advantages such that the risk of occurrence of defects on the multilayer reflective film is small in a process of forming the fiducial mark on the absorber film, that since the absorber film is made of a material which is processed into an absorber film pattern when manufacturing a reflective mask, it is easily processed by FIB or etching, and that since the thickness of the absorber film is thin compared to that of the multilayer reflective film, the processing time can be shortened, which is thus preferable.

(Structure 9)

The reflective mask blank according to Structure 7 or 8, wherein the fiducial mark comprises the main mark and an auxiliary mark arranged around the main mark.

As recited in Structure 9, since the fiducial mark comprises the main mark and the auxiliary mark arranged around the main mark, the main mark can be easily detected by the electron beam writing apparatus or the optical, EUV light, or electron beam defect inspection apparatus.

(Structure 10)

The reflective mask blank according to any of Structures 7 to 9, wherein the main mark has a polygonal shape having at least two pairs of sides each perpendicular to and parallel to scanning directions of the electron beam or the defect inspection light.

As recited in Structure 10, since the main mark has the polygonal shape (e.g. square shape, octagonal shape, or the like) having at least two pairs of sides each perpendicular to and parallel to the scanning directions of the electron beam writing apparatus or the defect inspection light, it is possible to improve ease (reliability) of detection by the electron beam writing apparatus or the defect inspection apparatus and to further suppress variation in defect detection position.

(Structure 11)

The reflective mask blank according to Structure 9, wherein the auxiliary mark has a rectangular shape with long sides perpendicular to and short sides parallel to the scanning direction of the electron beam or the defect inspection light.

As recited in Structure 11, since the auxiliary mark has the rectangular shape with the long sides perpendicular to and the short sides parallel to the scanning direction of the electron beam or the defect inspection light, it can be surely detected by scanning with the electron beam writing apparatus or the defect inspection apparatus so that a position of the main mark can be easily specified.

(Structure 12)

A reflective mask, wherein the absorber film of the reflective mask blank according to any of Structures 6 to 11 is patterned. The reflective mask obtained by patterning the absorber film of the reflective mask blank with the above-mentioned structure is reduced in defects by correcting/modifying writing data based on the defect information of the multilayer reflective film formed substrate or the reflective mask blank.

(Structure 13)

A mask blank, comprising a substrate; a thin film which is formed on the substrate and which becomes a transfer pattern; and a fiducial mark which serves as a reference for a defect position in defect information; wherein the fiducial mark comprises a main mark for determining a reference point for the defect position, and wherein the main mark has a point-symmetrical shape and has a portion with a width of 200 nm or more and 10 µm or less with respect to a scanning direction of an electron beam or defect inspection light.

As recited in Structure 13, the mask blank according to this invention is, as in Structure 1, formed with the fiducial mark which serves as the reference for the defect position in the defect information and this fiducial mark comprises the main mark for determining the reference point for the defect position. This main mark has the point-symmetrical shape and has the portion with the width of 200 nm or more and 10 µm or less with respect to the scanning direction of the electron beam or the defect inspection light. The fiducial mark thus configured can be easily detected, i.e. can be surely detected, by either an electron beam writing apparatus or an optical, EUV light, or electron beam defect inspection apparatus. Further, since the main mark has the point-symmetrical shape, the offset of the reference point for the defect position, which is determined by scanning with the electron beam or the defect inspection light, can be made small. If the fiducial mark is formed on an edge basis or if the fiducial mark is formed at an arbitrary position and then a formation position of the fiducial mark is specified by a coordinate measuring apparatus, the size of the fiducial mark can be made smaller and, in that case, the fiducial mark may consist of only the main mark. When the size of the fiducial mark can be reduced as described above, if, for example, FIB (focused ion beam) is used as a fiducial mark forming means, the processing time can be shortened, and further, the fiducial mark detection time can also be shortened. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured mask.

(Structure 14)

A mask blank, comprising a substrate; a thin film which is formed on the substrate and which becomes a transfer pattern; and a fiducial mark which serves as a reference for a defect position in defect information; wherein the fiducial mark comprises a main mark for determining a reference point for the defect position and an auxiliary mark arranged around the main mark, and wherein the main mark has a point-symmetrical shape and has a portion with a width of 200 nm or more and 10 µm or less with respect to a scanning direction of an electron beam or defect inspection light.

As recited in Structure 14, the mask blank according to this invention is, as in Structure 2, formed with the fiducial mark which serves as the reference for the defect position in the defect information and this fiducial mark comprises the main mark for determining the reference point for the defect position and the auxiliary mark arranged around the main mark. This main mark has the point-symmetrical shape and has the portion with the width of 200 nm or more and 10 µm or less with respect to the scanning direction of the electron beam or the defect inspection light. The fiducial mark thus configured can be easily detected, i.e. can be surely detected, by either an electron beam writing apparatus or an optical defect inspection apparatus. Further, since the main mark has the point-symmetrical shape, the offset of the reference point for the defect position, which is determined by scanning with the electron beam or the defect inspection light, can be made small. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured mask.

(Structure 15)

A mask, wherein the thin film of the mask blank according to Structure 13 or 14 is patterned.

The mask obtained by patterning the thin film of the mask blank with the above-mentioned structure is reduced in defects by modifying writing data based on the defect information of the mask blank.

(Structure 16)

A method of manufacturing the multilayer reflective film formed substrate according to any of Structures 1 to 5, comprising forming the fiducial mark at a predetermined position from an origin which was set based on edge coordinates of the substrate; and correlating the multilayer reflective film formed substrate comprising the fiducial mark and formation position information of the fiducial mark with each other.

In this manner, if the multilayer reflective film formed substrate is manufactured by correlating the multilayer reflective film formed substrate formed with the fiducial mark at the predetermined position from the origin which was set based on the edge coordinates of the substrate and the formation position information of the fiducial mark with each other, a user provided with this multilayer reflective film formed substrate can surely detect the fiducial mark in a short time using this formation position information of the fiducial mark.

(Structure 17)

A method of manufacturing the multilayer reflective film formed substrate according to any of Structures 1 to 5, comprising specifying, after forming the fiducial mark, a formation position of the fiducial mark by a coordinate measuring apparatus; and correlating the multilayer reflective film formed substrate comprising the fiducial mark and formation position information of the fiducial mark with each other.

In this manner, if the multilayer reflective film formed substrate is manufactured by specifying, after forming the fiducial mark, the formation position of the fiducial mark by the coordinate measuring apparatus and correlating the multilayer reflective film formed substrate formed with the fiducial mark and the formation position information of the fiducial mark with each other, a user provided with this multilayer reflective film formed substrate can surely detect the fiducial mark in a short time using this formation position information of the fiducial mark. Since the formation position of the fiducial mark is specified by the coordinate measuring apparatus, conversion of reference coordinates of an electron beam writing apparatus is enabled. Therefore, the user provided with the multilayer reflective film formed substrate can accurately collate defect positions easily specified based on the fiducial mark by a defect inspection apparatus and writing data with each other so that it is possible to surely reduce defects in a finally manufactured mask.

(Structure 18)

The multilayer reflective film formed substrate manufacturing method according to Structure 16 or 17, further comprising adding defect information based on the fiducial mark to the formation position information of the fiducial mark.

As recited in Structure 18, if the multilayer reflective film formed substrate is manufactured by adding the defect information based on the fiducial mark to the formation position information of the fiducial mark, the user provided with this multilayer reflective film formed substrate can surely detect the fiducial mark in a short time using this formation position information of the fiducial mark and, in the manufacture of a mask, the user can accurately correct (modify) writing data based on this defect information so as to reduce the influence due to defects, thereby reducing defects in a finally manufactured mask.

(Structure 19)

A reflective mask blank manufacturing method, comprising correlating a reflective mask blank having an absorber film for absorbing EUV light on the multilayer reflective film of the multilayer reflective film formed substrate comprising the fiducial mark according to any of Structures 16 to 18 and the formation position information of the fiducial mark with each other.

As recited in Structure 19, if the reflective mask blank formed with the absorber film, which is adapted to absorb the EUV light, on the multilayer reflective film of the multilayer reflective film formed substrate formed with the fiducial mark according to any of Structures 16 to 18 and the formation position information of the fiducial mark are correlated with each other and provided to a user, the user can surely detect the fiducial mark in a short time using this formation position information of the fiducial mark in the manufacture of a mask using this reflective mask blank.

(Structure 20)

A method of manufacturing the reflective mask blank according to any of Structures 6 to 11, comprising forming the fiducial mark at a predetermined position from an origin which was set based on edge coordinates of the substrate; and correlating the reflective mask blank comprising the fiducial mark and formation position information of the fiducial mark with each other.

In this manner, if the reflective mask blank is manufactured by correlating the reflective mask blank formed with the fiducial mark at the predetermined position from the origin which was set based on the edge coordinates of the substrate and the formation position coordinates of the fiducial mark with each other, a user provided with this reflective mask blank can surely detect the fiducial mark in a short time using this formation position information of the fiducial mark.

(Structure 21)

A method of manufacturing the reflective mask blank according to any of Structures 6 to 11, comprising specifying, after forming the fiducial mark, a formation position of the fiducial mark by a coordinate measuring apparatus; and correlating the reflective mask blank comprising the fiducial mark and formation position information of the fiducial mark with each other.

In this manner, if the reflective mask blank is manufactured by specifying, after forming the fiducial mark, the formation position of the fiducial mark by the coordinate measuring apparatus and correlating the reflective mask blank formed with the fiducial mark and the formation position information of the fiducial mark with each other, a user provided with this reflective mask blank can surely detect the fiducial mark in a short time using this formation position information of the fiducial mark. Since the formation position of the fiducial mark is specified by the coordinate measuring apparatus, conversion of reference coordinates of an electron beam writing apparatus is enabled. Therefore, the user provided with the multilayer reflective film formed substrate can accurately collate defect positions easily specified based on the fiducial mark by a defect inspection apparatus and writing data with each other so that it is possible to surely reduce defects in a finally manufactured mask.

(Structure 22)

A method of manufacturing the mask blank according to Structure 13 or 14, comprising forming the fiducial mark at a predetermined position from an origin which was set based on edge coordinates of the substrate; and correlating the mask blank comprising the fiducial mark and formation position information of the fiducial mark with each other.

As recited in Structure 22, if the mask blank is manufactured by correlating the mask blank formed with the fiducial mark at the predetermined position from the origin which was set based on the edge coordinates of the substrate and the formation position information of the fiducial mark with each other, a user provided with this mask blank can surely detect the fiducial mark in a short time using this formation position information of the fiducial mark.

(Structure 23)

A method of manufacturing the mask blank according to Structure 13 or 14, comprising specifying, after forming the fiducial mark, a formation position of the fiducial mark by a coordinate measuring apparatus; and correlating the mask blank comprising the fiducial mark and formation position information of the fiducial mark with each other.

As recited in Structure 23, if the mask blank is manufactured by specifying, after forming the fiducial mark, the formation position of the fiducial mark by the coordinate measuring apparatus and correlating the mask blank formed with the fiducial mark and the formation position information of the fiducial mark with each other, a user provided with this mask blank can surely detect the fiducial mark in a short time using this formation position information of the fiducial mark. Since the formation position of the fiducial mark is specified by the coordinate measuring apparatus, conversion of reference coordinates of an electron beam writing apparatus is enabled. Therefore, the user provided with the mask blank can accurately collate defect positions easily specified based on the fiducial mark by a defect inspection apparatus and writing data with each other so that it is possible to surely reduce defects in a finally manufactured mask.

(Structure 24)

The mask blank manufacturing method according to Structure 22 or 23, further comprising adding defect information based on the fiducial mark to the formation position information of the fiducial mark.

As recited in Structure 24, if the defect information based on the fiducial mark is added to the formation position information of the fiducial mark and provided to the user, the user can surely detect the fiducial mark in a short time using this formation position information of the fiducial mark and, in the manufacture of a mask, the user can accurately correct (modify) writing data based on this defect information so as to reduce the influence due to defects, thereby reducing defects in a finally manufactured mask.

Effect of the Invention

According to this invention, by forming a fiducial mark that can be surely detected by either an electron beam writing apparatus or a defect inspection apparatus and that allows the offset of a reference point for a defect position, which is determined by scanning with an electron beam or defect inspection light, to be small, it is possible to provide a multilayer reflective film formed substrate, a reflective mask blank, and a mask blank each capable of accurately carrying out management of coordinates of a defect (management of relative positions between the fiducial mark and a defect).

Further, according to this invention, it is possible to provide a reflective mask and a mask each using the multilayer reflective film formed substrate or the mask blank and reduced in defects by modifying writing data based on defect information thereof.

Further, according to this invention, it is possible to provide a multilayer reflective film formed substrate manufacturing method, a reflective mask blank manufacturing method, and a mask blank manufacturing method, which each correlate a multilayer reflective film formed substrate, a reflective mask blank, or a mask blank having a fiducial mark which is formed on an edge basis or having a fiducial mark which is formed and then a formation position of which is specified by a coordinate measuring apparatus and formation position information of the fiducial mark with each other.

MODE FOR CARRYING OUT THE INVENTION

Hereinbelow, embodiments of this invention will be described in detail.

[Fiducial Mark]

First, a fiducial mark in this invention (hereinafter may also be referred to as a "fiducial mark of this invention") will be described in detail.

Figure 1:
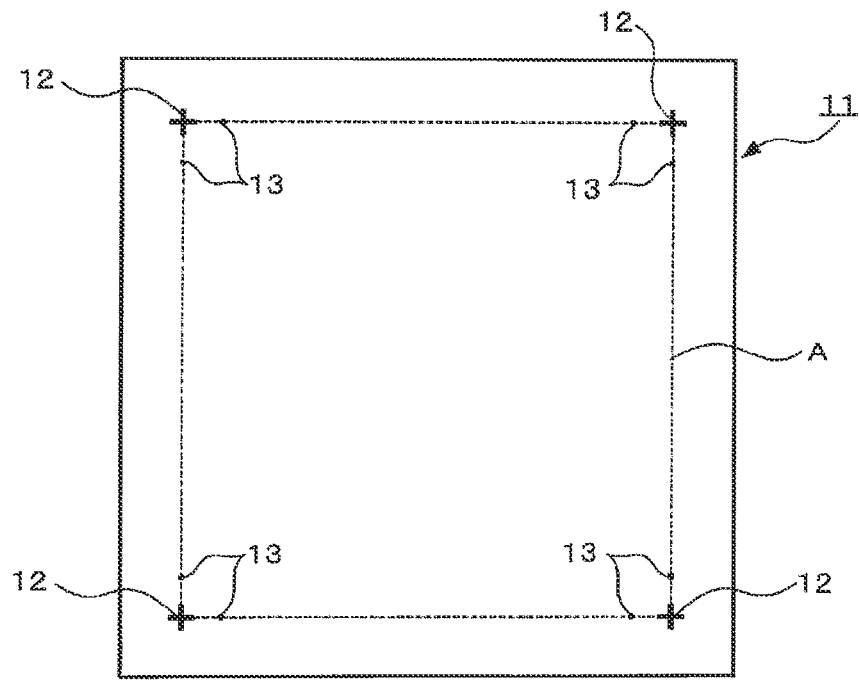
FIG. 1 is a plan view showing an example of the arrangement of fiducial marks in this invention.

FIG. 1 is a plan view of a mask blank glass substrate showing an example of the arrangement of fiducial marks.

In FIG. 1, two kinds of marks, i.e. relatively large rough alignment marks 12 and fiducial marks 13 of this invention as relatively small fine marks, are formed. Although the fiducial marks are shown on a surface of a glass substrate 11 in FIG. 1, FIG. 1 only shows the example of the arrangement of the fiducial marks over the main surface of the glass substrate and thus is, of course, not intended to limit this invention to the manner in which the fiducial marks are formed directly on the glass substrate.

The rough alignment mark 12 itself does not have a role of a fiducial mark, but has a role of facilitating detection of a position of the fiducial mark 13. Since the size of the fiducial mark 13 is small, it is difficult to locate its position by visual observation. On the other hand, if an attempt is made to detect the fiducial mark 13 using inspection light or an electron beam from the beginning, the detection takes time and, thus, if a resist film is formed, there is a possibility of causing unwanted resist exposure, which is thus not preferable. By providing the rough alignment mark 12 whose positional relationship with the fiducial mark 13 is determined in advance, the fiducial mark 13 can be detected quickly and easily.

FIG. 1 shows the example in which the rough alignment marks 12 are arranged at four positions near corners of the main surface of the rectangular glass substrate 11 and the fiducial marks 13 are arranged at two positions near each of the rough alignment marks 12. The rough alignment marks 12 and the fiducial marks 13 are preferably formed on a boundary line of a pattern forming region, defined by a broken line A, of the substrate main surface or on the outer peripheral edge side outside the pattern forming region. However, if it is too close to the outer peripheral edge of the substrate, it may be a region where the flatness of the substrate main surface is not good or there is a possibility of crossing another kind of identification mark, which is thus not preferable.

The number of the fiducial marks and the number of the rough alignment marks are not particularly limited. With respect to the fiducial marks, the number of them should be at least three and may be three or more.

As will be described hereinbelow, the fiducial mark 13 of this invention comprises a main mark for determining a position (reference point) which serves as a reference for a defect position and auxiliary marks arranged around the main mark for roughly specifying the main mark and, therefore, if there is no particular inconvenience in detecting the fiducial mark 13 of this invention with inspection light or an electron beam from the beginning, it is not necessary to provide the rough alignment mark 12.

Figure 15:
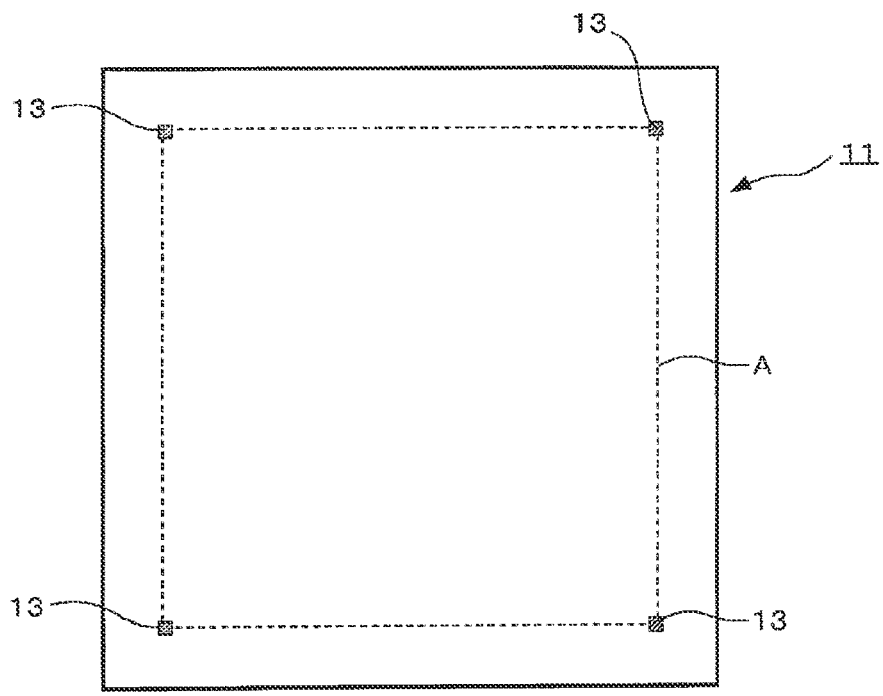
FIG. 15 is a plan view showing another example of the arrangement of fiducial marks in this invention.

That is, in this invention, as shown in FIG. 15, for example, as one example, the fiducial marks 13 of this invention may be arranged at four positions near the corners of the main surface of the glass substrate 11 without providing the above-mentioned rough alignment marks. By this, it is possible to omit the process of forming the relatively large rough alignment marks and thus to significantly shorten the mark processing time.

Figure 2:
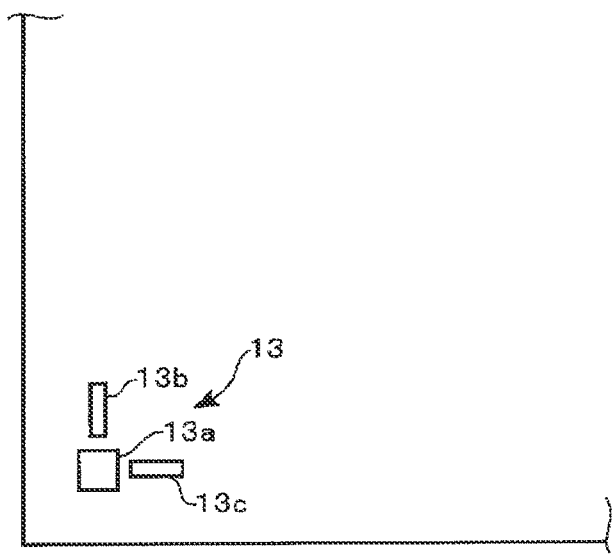
FIG. 2 is a diagram showing an example of the shape and arrangement of a main mark and auxiliary marks constituting the fiducial mark in this invention.
Figure 3:
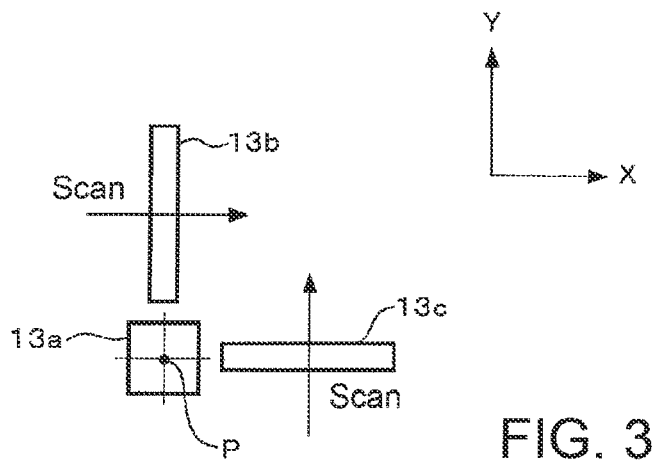
FIG. 3 is a diagram for explaining a method of determining a reference point using the fiducial mark in this invention.

FIG. 2 is a diagram showing an example of the shape and arrangement of a main mark and auxiliary marks constituting the fiducial mark of this invention. FIG. 3 is a diagram for explaining a method of determining a reference point using the fiducial mark of this invention.

The fiducial mark serves as a reference for a defect position in defect information. The fiducial mark 13 of this invention comprises a main mark for determining a position (reference point) which serves as a reference for a defect position and auxiliary marks arranged around the main mark. One of features of the fiducial mark of this invention is that the main mark has a point-symmetrical shape and has a portion with a width of 200 nm or more and 10 µm or less with respect to a scanning direction of an electron beam or defect inspection light.

FIGS. 2 and 3 show, by way of example, the fiducial mark 13 comprising a main mark 13a and two auxiliary marks 13b and 13c arranged around the main mark 13a.

In this invention, the main mark 13a preferably has a polygonal shape having at least two pairs of sides each perpendicular to and parallel to scanning directions of an electron beam writing apparatus or defect inspection light (X- and Y-directions in FIG. 3). In this manner, when the main mark 13a has the polygonal shape having at least two pairs of sides each perpendicular to and parallel to the scanning directions of the electron beam or the defect inspection light, it is possible to improve ease (reliability) of detection by an electron beam writing apparatus or a defect inspection apparatus and to further suppress variation in defect detection position. FIGS. 2 and 3 show, as a specific example, a case where the main mark 13a has a square shape with the same length in longitudinal and lateral directions (X- and Y-directions). In this case, the longitudinal and lateral lengths (L) are each 200 nm or more and 10 µm or less.

Figure 4:
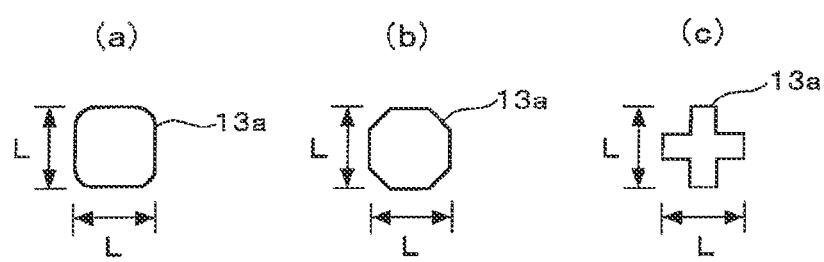
FIG. 4 is diagrams each showing another example of the shape of a main mark.

The main mark 13a is satisfactory if it has a point-symmetrical shape. The shape is not limited to the above-mentioned square shape and may be, for example, a square shape with rounded corners as shown at (a) in FIG. 4, an octagonal shape as shown at (b) in the same figure, or a cross shape as shown at (c) in the same figure. Also in this case, the dimensions (longitudinal and lateral lengths (L)) of the main mark 13a are each set to 200 nm or more and 10 µm or less. As a specific example, in the case of the main mark 13a having the cross shape, its dimensions (longitudinal and lateral lengths) may each be set to 5 µm or more and 10 µm or less. Although not illustrated, the main mark 13a may alternatively have a perfect circular shape with a diameter of 200 nm or more and 10 µm or less.

The two auxiliary marks 13b and 13c are arranged around the main mark 13a along scanning directions of an electron beam or defect inspection light (X- and Y-directions in FIG. 3). In this invention, the auxiliary marks 13b and 13c each preferably have a rectangular shape with long sides perpendicular to and short sides parallel to the scanning direction of the electron beam or the defect inspection light. When the auxiliary mark has the rectangular shape with the long sides perpendicular to and the short sides parallel to the scanning direction of the electron beam or the defect inspection light, it can be surely detected by scanning with the electron beam writing apparatus or the defect inspection apparatus so that a position of the main mark can be easily specified. In this case, the long side preferably has a length which is detectable by the minimum number of times of scanning with the electron beam writing apparatus or the defect inspection apparatus. For example, the long side preferably has a length of 25 µm or more and 600 µm or less. On the other hand, if the length of the long side is short, for example, less than 25 µm, there is a possibility that the auxiliary mark cannot be easily detected by scanning with the electron beam writing apparatus or the defect inspection apparatus. If the length of the long side is long, for example, more than 600 μm, the processing time exceeds one hour per portion depending on a fiducial mark forming method, which is thus not preferable. The length of the long side is more preferably 25 μm or more and 400 μm or less and further preferably 25 μm or more and 200 μm or less.

The auxiliary mark 13b, 13c and the main mark 13a may be spaced apart from each other by a predetermined distance or are not necessarily spaced apart from each other. When the auxiliary mark and the main mark are spaced apart from each other, the distance therebetween is not particularly limited, but, in this invention, it is preferably in a range of, for example, about 25 μm to 50 μm.

The main mark 13a and the auxiliary marks 13b and 13c each have a concave cross-sectional shape and are provided with a required depth in a height direction of the fiducial mark, thereby forming the fiducial mark that can be recognized. In terms of improving the detection accuracy by an electron beam or defect inspection light, the cross-sectional shape is preferably formed to widen from the bottom of the concave shape toward the surface side and, in this case, the inclination angle of a side wall of the fiducial mark is preferably 75° or more, more preferably 80° or more, and further preferably 85° or more.

Using the fiducial mark described above, a reference point which serves as a reference for a defect position is determined in the following manner (see FIG. 3).

When an electron beam or defect inspection light scans over the auxiliary marks 13b and 13c in the X- and Y-directions and detects these auxiliary marks, a position of the main mark 13a can be roughly specified. After an electron beam or inspection light scans over the main mark 13a, whose position was specified, in the X- and Y-directions, a reference point is determined as an intersection point P (normally, the approximate center of the main mark) over the main mark 13a (detected by the scanning of the auxiliary marks).

Figure 13:
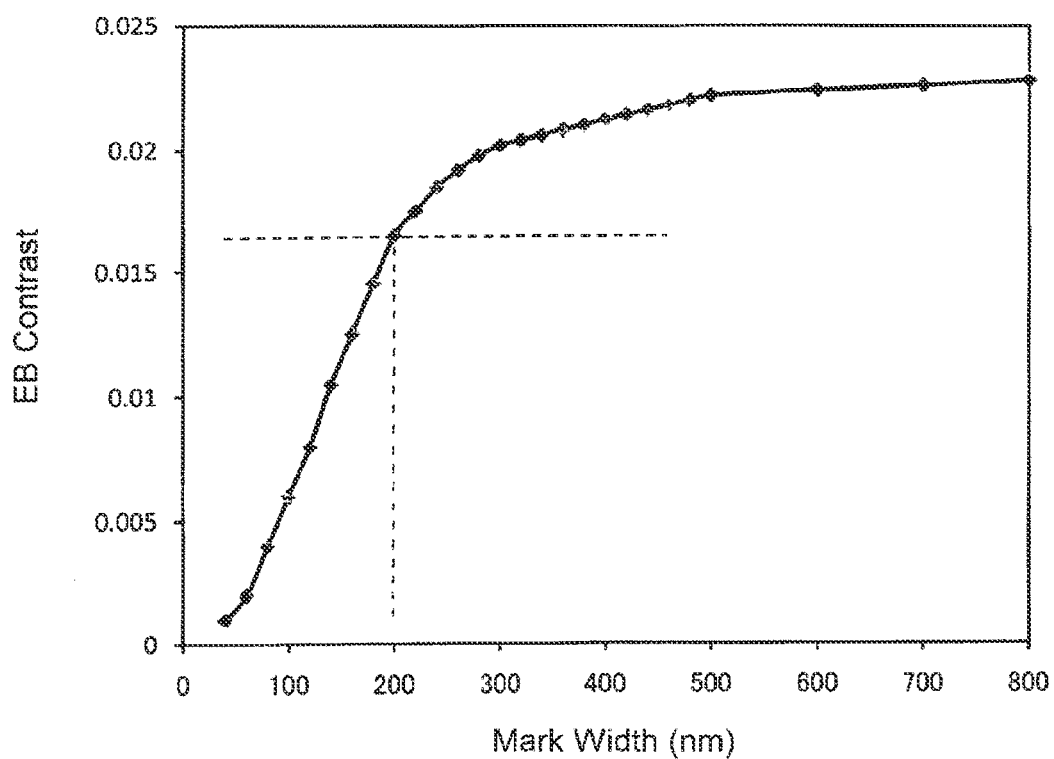
FIG. 13 is a diagram showing the relationship between the width of a main mark and the electron beam contrast.
Figure 14:
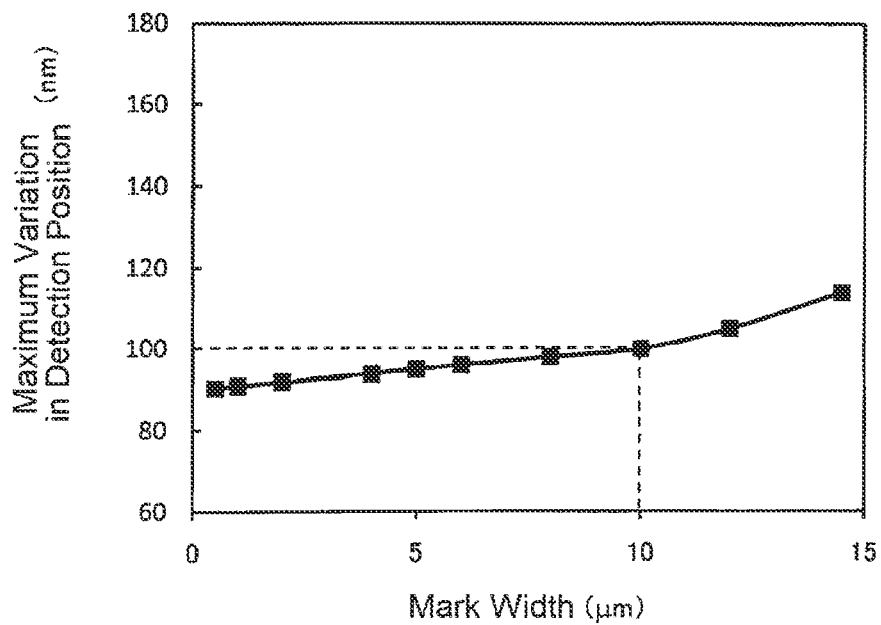
FIG. 14 is a diagram showing the relationship between the width of a main mark and the maximum variation in detection position.

As described above, in this invention, the main mark 13a has a point-symmetrical shape and has a portion with a width of 200 nm or more and 10 μm or less with respect to a scanning direction of an electron beam or defect inspection light. The present inventors have studied the relationship between the width of the main mark 13a and the contrast for an electron beam and the relationship between the width of the main mark 13a and the variation in defect detection position. FIG. 13 is a diagram showing the relationship between the main mark width and the electron beam contrast and FIG. 14 is a diagram showing the relationship between the main mark width and the maximum variation in defect detection position. FIG. 13 is the diagram showing the relationship between the main mark width and the EB (electron beam) contrast, wherein, with respect to a resist film formed reflective mask blank in which, at a predetermined position of a multilayer reflective film (total thickness: 280 nm) which, given that a Si film (thickness: 4.2 nm) and a Mo film (thickness: 2.8 nm) formed one cycle, was formed by laminating Si films and Mo films by 40 cycles on a $SiO_2$—$TiO_2$-based glass substrate, a square main mark was formed (by removing all layers of the multilayer reflective film by FIB), and a Ru protective film (thickness: 2.5 nm), an absorber film (total thickness: 70 nm), and a resist film (thickness: 100 nm) were formed on the multilayer reflective film, the EB reflection intensity which was detected when EB (electron beam) scanned over the main mark was measured. Various sizes of marks were formed and the electron beam contrast was obtained by contrast=(Imax−Imin)/(Imax+Imin), where Imin represents an EB (electron beam) intensity at a bottom portion (glass) of the mark and Imax represents an EB (electron beam) intensity at a multilayer film portion. FIG. 14 shows the results, wherein, with respect to a multilayer reflective film formed substrate in which, at a predetermined position of a multilayer reflective film (total thickness: 280 nm) which, given that a Si film (thickness: 4.2 nm) and a Mo film (thickness: 2.8 nm) formed one cycle, was formed by laminating Si films and Mo films by 40 cycles on a $SiO_2$—$TiO_2$-based glass substrate, a square main mark was formed (by removing all layers of the multilayer reflective film by FIB), the main mark was detected and variation in defect detection position was measured using a defect inspection apparatus (Teron 600 Series manufactured by KLA-Tencor Corporation). Defect inspection was carried out five times and variation of detected defect positions based on reference coordinates was obtained as the variation in defect detection position.

As shown in FIG. 13, the results are such that when the width of the main mark 13a becomes less than 200 nm, the EB contrast is largely reduced. That is, since it becomes difficult to detect the main mark by EB (electron beam) scanning, correction/modification of writing data cannot be carried out with high accuracy. The contrast is 0.006 when the width of the main mark 13a is 100 nm while the contrast is 0.016 when the width of the main mark 13a is 200 nm, and therefore, the difference in contrast is 2.75 times. On the other hand, as shown in FIG. 14, when the width of the main mark 13a exceeds 10 μm, variation in defect detection position exceeds 100 nm. This cannot satisfy the variation in defect detection position of 100 nm or less when the fiducial mark is used as a reference point, which is required for achieving/enabling the above-mentioned Defect mitigation technology. Therefore, in order to satisfy both the contrast and the variation in defect detection position, it is important that the main mark 13a have a portion with a width of 200 nm or more and 10 μm or less with respect to a scanning direction of an electron beam or defect inspection light.

Further, when, for example, a fiducial mark is formed on a multilayer reflective film and its width is narrow (specifically, when it is 30 to 100 nm as described in Patent Document 1), there also occurs an inconvenience that if an absorber film and so on are formed on the multilayer reflective film, a concave portion of the fiducial mark is buried so that it is difficult to detect the fiducial mark.

In the meantime, as described above, the auxiliary marks 13b and 13c each preferably have a rectangular shape with long sides perpendicular to and short sides parallel to a scanning direction of an electron beam or defect inspection light. In this case, the long side preferably has a length which is detectable by the minimum number of times of scanning with the electron beam writing apparatus or the defect inspection apparatus, for example, a length of 25 μm or more and 600 μm or less. However, if, for example, this length of about several hundred μm is formed by a focused ion beam, the processing time is required to be long.

Figure 5:
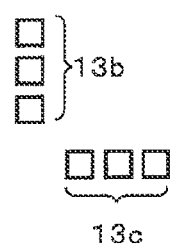
FIG. 5 is a diagram showing another example of the shape of auxiliary marks.
Figure 6:
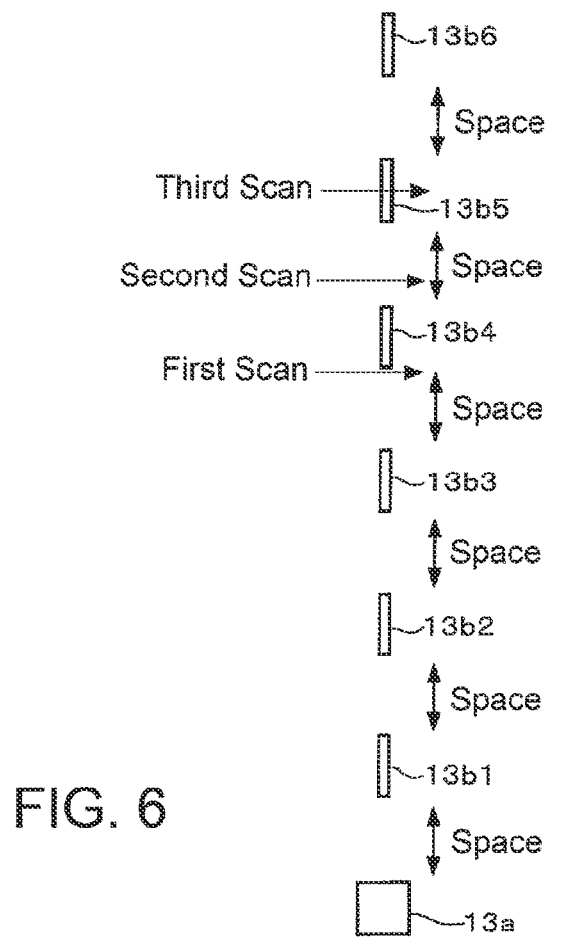
FIG. 6 is a diagram for explaining one example of a method of detecting an auxiliary mark.

In view of this, as shown in FIG. 5, the auxiliary mark can be divided into several rectangles. FIG. 6 is an example specifically showing such an arrangement, wherein rectangular auxiliary marks 13b1 to 13b6 each having a size of 50 μm×1 μm are arranged at regular intervals on one side (Y-direction) of a main mark 13a having a size of 5 μm×5 μm and the interval (space) between the auxiliary marks is set to 50 μm.

In this case, for example, a first scan (first scanning) misses the auxiliary mark, then a second scan (second scanning) shifted upward (Y-direction) by 60 μm also misses the auxiliary mark, and then a third scan (third scanning) shifted further upward by 60 μm can detect the auxiliary mark 13b5.

Even if the auxiliary mark is divided and the length of the long side of each of the divided individual auxiliary marks is shortened as described above, the auxiliary mark can be surely detected with the minimum number of times of scanning by determining the scanning rule. Further, the overall processing time can be shortened by dividing the auxiliary mark as described above.

The position of forming the main mark 13a and the auxiliary marks 13b and 13c which constitute the fiducial mark 13 of this invention is not particularly limited. For example, in the case of a reflective mask blank, they may be formed at any position as long as it is on a film-forming surface of a multilayer reflective film. For example, they may be formed at any position of a substrate, an underlayer (described later), a multilayer reflective film, a protective film (capping layer, buffer layer), an absorber film, or an etching mask film formed on the absorber film.

In the case of a reflective mask which uses EUV light as exposure light, a defect present particularly on a multilayer reflective film is almost impossible to correct and can be a serious phase defect on a transfer pattern and, therefore, defect information on the multilayer reflective film is important in order to reduce transfer pattern defects. Therefore, it is preferable to carry out defect inspection at least after forming the multilayer reflective film to obtain defect information. For this, it is preferable that a multilayer reflective film formed substrate be formed with a fiducial mark of this invention. In particular, in terms of ease of detection, recycling of a substrate, and so on, it is preferable to form the fiducial mark of this invention on the multilayer reflective film.

On the other hand, in terms of suppressing a change in optical properties (e.g. reflectance) due to cleaning after forming a fiducial mark, it is preferable to form a fiducial mark on an absorber film of a reflective mask blank. In this case, since the fiducial mark is not formed at a stage of a multilayer reflective film formed substrate, defect inspection and management of coordinates of defects using the fiducial mark as a reference can be carried out in the following manner for the reflective mask blank.

First, with respect to a multilayer reflective film formed substrate in which a multilayer reflective film is formed on a substrate, defect inspection is carried out by a defect inspection apparatus using the center of a substrate main surface as a reference point, thereby obtaining defects and their position information detected by the defect inspection. Then, a protective film and an absorber film are formed on the multilayer reflective film and then a fiducial mark of this invention is formed at a predetermined position of the absorber film, thereby obtaining a reflective mask blank formed with the fiducial mark.

Defect inspection is carried out by a defect inspection apparatus using the fiducial mark as a reference. Since the absorber film is formed over the multilayer reflective film as described above, defect inspection data of this defect inspection also reflects the defect inspection of the multilayer reflective film formed substrate obtained above. Therefore, by collating the defect inspection data of the multilayer reflective film formed substrate and the defect inspection data of the reflective mask blank with each other based on those defects which are consistent between the multilayer reflective film formed substrate and the reflective mask blank, defect inspection data of the multilayer reflective film formed substrate and defect inspection data of the reflective mask blank, both using the fiducial mark as a reference, can be obtained.

A method of forming the main mark 13a and the auxiliary marks 13b and 13c which constitute the fiducial mark 13 of this invention is not particularly limited. For example, when the cross-sectional shape of the fiducial mark is concave, the fiducial mark can be formed by photolithography, recess formation by laser light or an ion beam, machining trace by scanning a diamond stylus, indention by a micro-indenter, stamping by an imprint method, or the like.

As described above, if the fiducial mark of this invention is formed on the multilayer reflective film formed substrate or the like, the fiducial mark of this invention can be easily detected, i.e. can be surely detected, by either an electron beam writing apparatus or an optical defect inspection apparatus. Further, since it has the point-symmetrical shape, the offset of a reference point for a defect position, which is determined by scanning with an electron beam or defect inspection light, can be made small. Therefore, variation in defect detection position inspected based on the fiducial mark is small. By this, in defect inspection, it is possible to determine a reference point for a defect position and to obtain accurate defect information (defect map) including defect position (relative positions between the reference point and a defect) information. Further, in the manufacture of a mask, it is possible to collate pre-designed writing data (mask pattern data) with this defect information and to accurately correct (modify) the writing data so as to reduce the influence due to defects and, as a result, it is possible to reduce defects in a finally manufactured reflective mask.

In the above-mentioned embodiment, the description has been given of the example in which the two auxiliary marks 13b and 13c are arranged around the main mark 13a along the scanning directions of the electron beam writing apparatus or the defect inspection apparatus (X- and Y-directions). However, this invention is not limited to such an embodiment. For example, in a system where defect detection is not based on scanning with inspection light, if the positional relationship between a main mark and an auxiliary mark is specified, the arrangement position of the auxiliary mark relative to the main mark is arbitrary. Further, in this case, not the center of the main mark, but its edge can alternatively be used as a reference point.

In the meantime, as described above, the fiducial mark 13 of this invention is formed at an arbitrary position on the boundary line of the pattern forming region, defined by the broken line A, of the substrate main surface or on the outer peripheral edge side outside the pattern forming region (see FIGS. 1 and 15). In this case, it is preferable to form the fiducial mark on an edge basis or to specify a fiducial mark formation position by a coordinate measuring apparatus after forming the fiducial mark.

Figure 17:
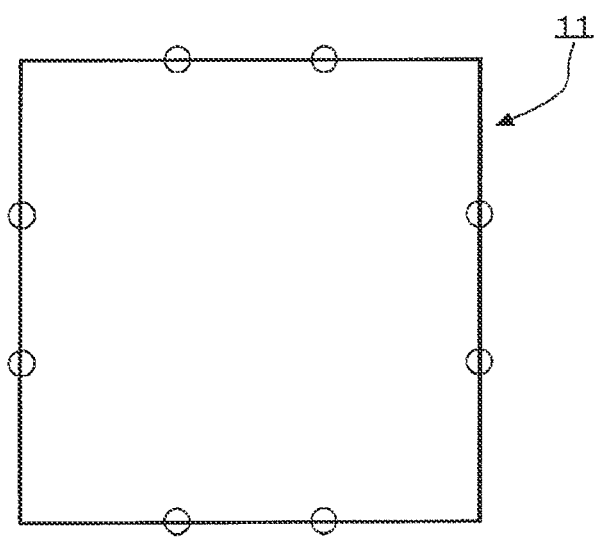
FIG. 17 is a diagram for explaining a method of forming a fiducial mark on an edge basis.
Figure 18:
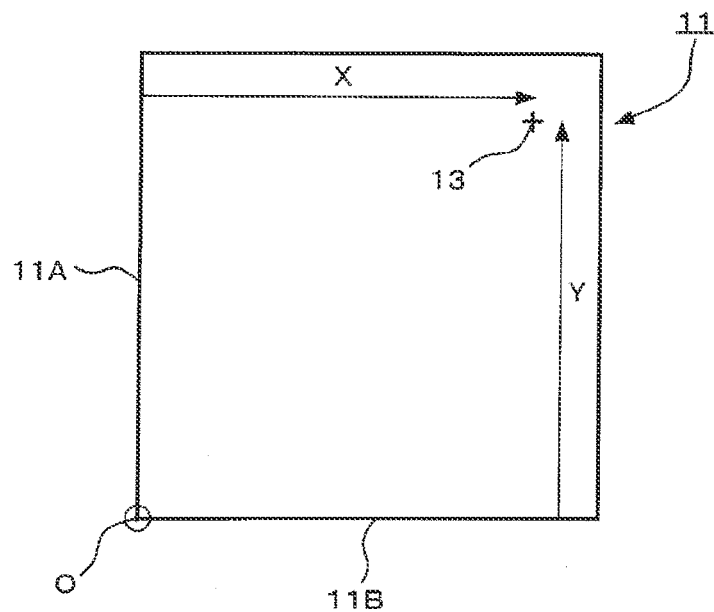
FIG. 18 is a diagram for explaining a method of forming a fiducial mark on an edge basis.

First, a method of forming a fiducial mark on the above-mentioned edge basis will be described. FIGS. 17 and 18 are diagrams each for explaining a method of forming a fiducial mark on the edge basis.

For example, when forming a fiducial mark on a multilayer reflective film formed substrate using FIB (focused ion beam) as a fiducial mark forming means, detection of edges of the multilayer reflective film formed substrate is carried out. When processing a fiducial mark by FIB, edges of a glass substrate 11 of the multilayer reflective film formed substrate can be recognized by a secondary electron image, a secondary ion image, or an optical image. When processing a fiducial mark by another method (e.g. impression), it can be recognized by an optical image. As shown in FIG. 17, for example, edge coordinates of eight portions (circled portions) of four sides of the glass substrate 11 (illustration of a multilayer reflective film is omitted for convenience' sake) are confirmed, and then tilt correction is carried out to obtain the origin (0,0). The origin in this case can be arbitrarily set and may be a corner or the center of the substrate.

A fiducial mark is formed by FIB at a predetermined position from the origin which was set on the edge basis as described above. FIG. 18 shows a case where a fiducial mark 13 is formed at a predetermined position from the origin O (0,0) which was set at an arbitrary corner of the substrate on an edge basis, specifically, at a position distanced by X and Y respectively from edges of end faces 11A and 11B both adjacent to the origin O. In this case, fiducial mark formation coordinates (X,Y) based on the origin O (0,0) serve as fiducial mark formation position information. This also applies to a fiducial mark which is formed at another position.

When detecting a fiducial mark of a multilayer reflective film formed substrate (or a reflective mask blank, a mask blank), formed on such an edge basis, using a defect inspection apparatus or an electron beam writing apparatus, since fiducial mark formation position information, i.e. distances from edges, is known, it is possible to easily specify a formation position of the fiducial mark.

Alternatively, it is also possible to apply a method of specifying a fiducial mark formation position by a coordinate measuring apparatus after forming a fiducial mark at an arbitrary position of a multilayer reflective film formed substrate. This coordinate measuring apparatus measures fiducial mark formation coordinates on an edge basis and use can be made of, for example, a highly accurate pattern position measuring apparatus (LMS-IPRO4 manufactured by KLA-Tencor Corporation). The specified fiducial mark formation coordinates serve as fiducial mark formation position information. The coordinate measuring apparatus also serves to carry out conversion into reference coordinates of an electron beam writing apparatus and, therefore, a user provided with the multilayer reflective film formed substrate can accurately collate defect positions easily specified based on the fiducial mark by a defect inspection apparatus and writing data with each other so that it is possible to surely reduce defects in a finally manufactured mask.

As described above, according to the method of forming the fiducial mark on the edge basis or specifying the fiducial mark formation position by the coordinate measuring apparatus after forming the fiducial mark at the arbitrary position, since it is possible to easily specify the formation position of the fiducial mark of the multilayer reflective film formed substrate or the like using the defect inspection apparatus or the electron beam writing apparatus, it is possible to reduce the size of the fiducial mark. Specifically, when the fiducial mark 13 of this invention comprises the main mark and the auxiliary marks, the width of the main mark can be set to 200 nm or more and 10 μm or less and the length of the long side of the auxiliary mark can be set to, for example, 25 μm or more and 250 μm or less. When the size of the fiducial mark is reduced as described above, if, for example, the FIB is employed as the fiducial mark forming means, the fiducial mark processing time can be shortened, which is thus preferable. Further, the fiducial mark detection time can also be shortened, which is thus preferable.

Figure 16:
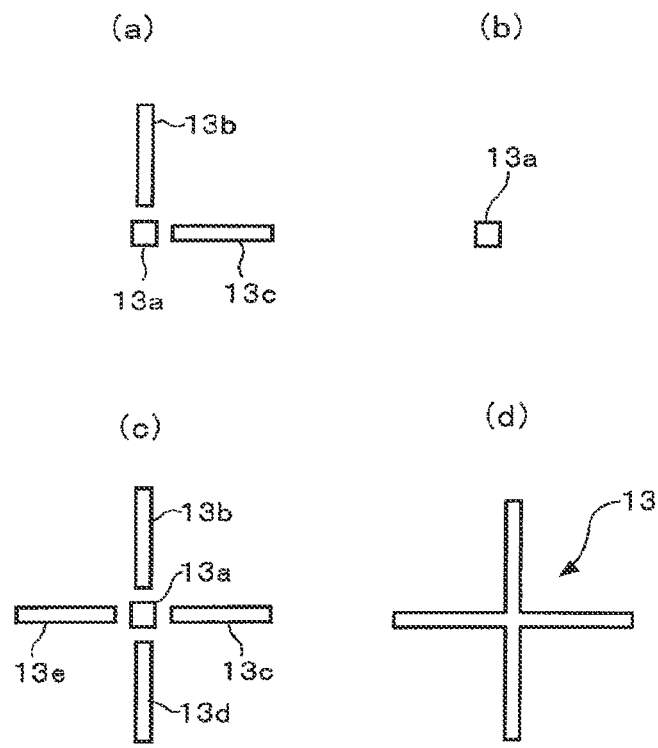
FIG. 16 is diagrams each showing an example of the shape and arrangement of a fiducial mark when it is formed on an edge basis.

FIG. 16 shows examples of the shape and arrangement of fiducial marks when forming them on the edge basis as described above, wherein the fiducial mark comprising a main mark 13a and auxiliary marks 13b and 13c as shown at (a) in the same figure is a typical example. Since the size of the fiducial mark can be reduced as described above, the auxiliary marks are not necessarily required and thus, for example, the fiducial mark may consist of only a main mark 13a as shown at (b) in the same figure. Alternatively, the fiducial mark may be such that four auxiliary marks 13b to 13e are arranged around a main mark 13a as shown at (c) in the same figure or the fiducial mark may be a cross-shaped fiducial mark as shown at (d) in the same figure.

If, for example, a multilayer reflective film formed substrate formed with a fiducial mark at a predetermined position from the origin which was set based on edge coordinates of a substrate and fiducial mark formation position information (fiducial mark formation coordinates) in this case are correlated with each other and provided to a user, the user can surely detect the fiducial mark in a short time using this fiducial mark formation position information, for example, in a mask manufacturing process.

If, for example, after a multilayer reflective film formed substrate is formed with a fiducial mark, a formation position of the fiducial mark is specified by a coordinate measuring apparatus and then the multilayer reflective film formed substrate formed with the fiducial mark and fiducial mark formation position information (specified fiducial mark position coordinates) in this case are correlated with each other and provided to a user, the user can surely detect the fiducial mark in a short time using this fiducial mark formation position information. Since the formation position of the fiducial mark is specified by the coordinate measuring apparatus, conversion of reference coordinates of an electron beam writing apparatus is enabled. Therefore, the user provided with the multilayer reflective film formed substrate can accurately collate defect positions easily specified based on the fiducial mark by a defect inspection apparatus and writing data with each other so that it is possible to surely reduce defects in a finally manufactured mask.

If defect information (position information, size, etc.) based on the fiducial mark is added to the above-mentioned fiducial mark formation position information and provided to the user, the user can surely detect the fiducial mark in a short time using this fiducial mark formation position information and further can accurately correct (modify) writing data based on this defect information so as to reduce the influence due to defects, thereby reducing defects in a finally manufactured mask.

If a reflective mask blank formed with an absorber film, which is adapted to absorb EUV light, on a multilayer reflective film of the multilayer reflective film formed substrate formed with the fiducial mark and fiducial mark formation position information are correlated with each other and provided to a user, the user can surely detect the fiducial mark in a short time using this fiducial mark formation position information in the manufacture of a mask using this reflective mask blank.

Also in the case of a mask blank in which a thin film to be a transfer pattern is formed on a substrate, if the mask blank formed with a fiducial mark at a predetermined position from the origin which was set based on edge coordinates of the substrate and fiducial mark formation position information in this case are correlated with each other and provided to a user, or if, after the mask blank is formed with a fiducial mark, a formation position of the fiducial mark is specified by a coordinate measuring apparatus and then the mask blank formed with the fiducial mark and fiducial mark formation position information in this case are correlated with each other and provided to a user, the user can surely detect the fiducial mark in a short time using this fiducial mark formation position information.

Also in the case of the mask blank, if defect information based on the fiducial mark is added to the fiducial mark formation position information and provided to the user, the user can accurately correct (modify) writing data based on this defect information so as to reduce the influence due to defects, thereby reducing defects in a finally manufactured mask.

[Multilayer Reflective Film Formed Substrate]

Figure 7:
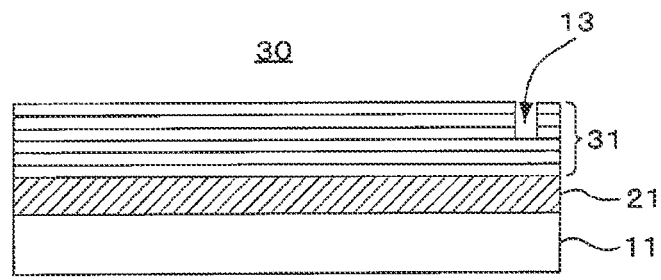
FIG. 7 is a cross-sectional view of a multilayer reflective film formed substrate according to this invention.

As shown in FIG. 7, this invention also provides a multilayer reflective film formed substrate 30 in which a fiducial mark 13 of this invention is formed on a multilayer reflective film 31 adapted to reflect EUV light.

In FIG. 7, there is shown an example in which the fiducial mark 13 is formed by removing part of films constituting the multilayer reflective film 31. Alternatively, the fiducial mark 13 may be formed by removing all layers constituting the multilayer reflective film 31.

The multilayer reflective film is a multilayer film in which low refractive index layers and high refractive index layers are alternately laminated. Generally, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of a Mo/Si cycle multilayer film in which Mo films and Si films are alternately laminated by about 40 cycles. Other than this, as a multilayer reflective film for use in a region of EUV light, there is a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, or the like. The material may be properly selected according to an exposure wavelength.

For EUV exposure, in order to prevent distortion of a pattern due to heat in exposure, use is preferably made of, as a glass substrate 11, a material having a low thermal expansion coefficient in a range of $0\pm1.0\times10^{-7}/°$ C., more preferably in a range of $0\pm0.3\times10^{-7}/°$ C. As the material having the low thermal expansion coefficient in this range, it is possible to use, for example, a $SiO_2$—$TiO_2$-based glass, a multicomponent glass-ceramic, or the like.

A main surface, on the side where a transfer pattern is to be formed, of the glass substrate 11 is surface-machined to have high flatness in terms of ensuring at least pattern transfer accuracy and pattern position accuracy. For EUV exposure, the flatness is preferably 0.1 μm or less and particularly preferably 0.05 μm or less in a 142 mm×142 mm region of the main surface, on the side where the transfer pattern is to be formed, of the glass substrate 11. A main surface, on the side opposite to the side where the transfer pattern is to be formed, of the glass substrate 11 is a surface which is electrostatically chucked when it is set in an exposure apparatus. The flatness thereof is 1 μm or less, preferably 0.5 μm or less in a 142 mm×142 mm region.

As described above, the material having the low thermal expansion coefficient, such as the $SiO_2$—$TiO_2$-based glass, is used as the glass substrate 11 of the multilayer reflective film formed substrate. However, with such a glass material, it is difficult to achieve high smoothness such as a surface roughness of 0.1 nm or less in RMS by precision polishing. Therefore, as shown in FIG. 7, it is preferable to form an underlayer 21 on the surface of the glass substrate 11 for the purpose of reducing the surface roughness of the glass substrate 11 or reducing defects of the surface of the glass substrate 11. As a material of such an underlayer 21, it does not need to have translucency for exposure light and it is preferable to select a material that can obtain high smoothness when a surface of the underlayer is precision-polished and that is excellent in defect quality. For example, Si or a silicon compound containing Si (e.g. $SiO_2$, SiON, or the like) is preferably used because high smoothness is obtained when precision-polished and the defect quality is excellent. Si is particularly preferable.

It is preferable that the surface of the underlayer 21 be precision-polished to a smoothness which is required as a substrate for a mask blank. It is preferable that the surface of the underlayer 21 be precision-polished to a root mean square roughness (RMS) of 0.15 nm or less, particularly preferably 0.1 nm or less. In consideration of the influence on a surface of the multilayer reflective film which is formed on the underlayer 21, it is preferable to precision-polish the surface of the underlayer 21 so that, in terms of the relationship with the maximum surface roughness (Rmax), Rmax/RMS becomes 2 to 10, particularly preferably 2 to 8.

The thickness of the underlayer 21 is preferably in a range of, for example, 75 nm to 300 nm.

[Mask Blank]

This invention also provides a reflective mask blank in which an absorber film to be a transfer pattern is formed on the multilayer reflective film of the multilayer reflective film formed substrate having the above-mentioned structure, and a mask blank in which a thin film to be a transfer pattern is formed on a mask blank glass substrate.

The multilayer reflective film formed substrate can be used as a substrate for a reflective mask blank which is for manufacturing a reflective mask, that is, which comprises, in order, on a substrate, a multilayer reflective film adapted to reflect exposure light (EUV light) and an absorber film for pattern formation adapted to absorb the exposure light (EUV light).

Figure 8:
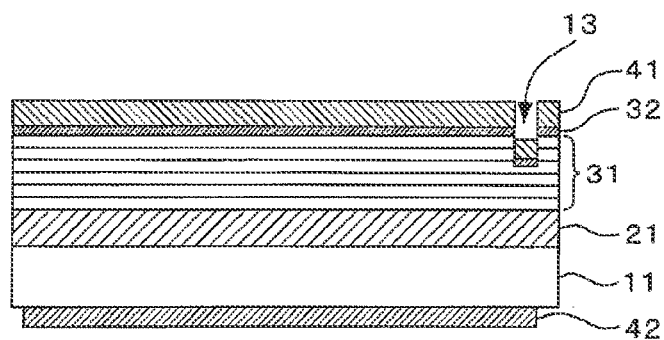
FIG. 8 is a cross-sectional view of a reflective mask blank according to this invention.

FIG. 8 shows a reflective mask blank 40 in which a protective layer (capping layer) 32 and an absorber film 41 for pattern formation adapted to absorb EUV light are formed on the multilayer reflective film 31, formed with the fiducial mark 13, of the multilayer reflective film formed substrate 30 of FIG. 7. On the side, opposite to the side where the multilayer reflective film and so on are formed, of the glass substrate 11, a back-side conductive film 42 is provided.

The absorber film 41 has the function of absorbing exposure light such as EUV light and use is preferably made of, for example, tantalum (Ta) alone or a material composed mainly of Ta. As the material composed mainly of Ta, use is made of a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, or the like.

Normally, for the purpose of protecting the multilayer reflective film in patterning the absorber film 41 or in pattern correction, the protective film 32 or a buffer film is provided between the multilayer reflective film and the absorber film. As a material of the protective film, use is made of silicon, ruthenium, or a ruthenium compound containing ruthenium and one or more elements from niobium, zirconium, and rhodium. As a material of the buffer film, a chromium-based material is mainly used.

Figure 19:
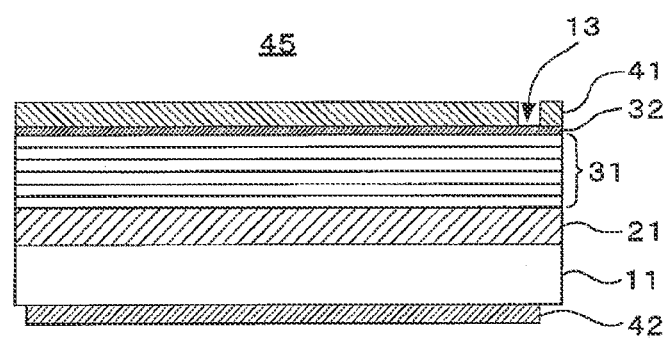
FIG. 19 is a cross-sectional view of a reflective mask blank according to another embodiment of this invention.

As shown in FIG. 19, this invention also provides a reflective mask blank 45 in which a fiducial mark 13 of this invention is formed in an absorber film 41 adapted to absorb EUV light. In FIG. 19, portions corresponding to those in FIG. 8 are assigned the same symbols.

In FIG. 19, there is shown an example in which the fiducial mark 13 is formed by removing the absorber film 41 so that a protective film 32 is exposed. Alternatively, the fiducial mark 13 may be formed by removing the absorber film 41 partially in depth, the fiducial mark 13 may be formed by removing the absorber film 41 and the protective film 32 so that a multilayer reflective film 31 is exposed, or the fiducial mark 13 may be formed by removing the absorber film 41, the protective film 32, and the multilayer reflective film 31 so that a substrate 11 is exposed.

Figure 9:
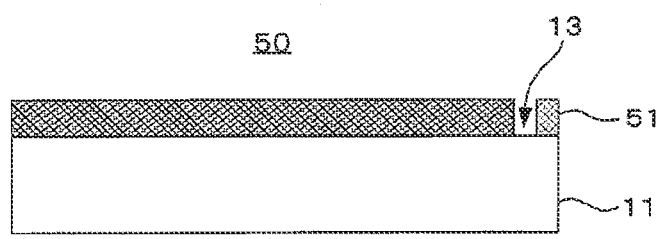
FIG. 9 is a cross-sectional view of a binary mask blank according to this invention.

FIG. 9 shows a binary mask blank 50 in which a light-shielding film 51 is formed on a glass substrate 11. A fiducial mark 13 of this invention is formed in the light-shielding film 51.

Although not illustrated, a phase shift mask blank is obtained by forming a phase shift film or a phase shift film and a light-shielding film on a glass substrate 11. It may be configured such that the above-mentioned underlayer 21 is provided on a surface of the glass substrate 11 if necessary.

The light-shielding film may be in the form of a single layer or a plurality of layers (e.g. a laminated structure of a light-shielding layer and an antireflection layer). When the light-shielding film has the laminated structure of the light-shielding layer and the antireflection layer, the light-shielding layer may have a structure comprising a plurality of layers. Likewise, the phase shift film may also be in the form of a single layer or a plurality of layers.

As such a mask blank, there can be cited, for example, a binary mask blank having a light-shielding film made of a material containing chromium (Cr), a binary mask blank having a light-shielding film made of a material containing a transition metal and silicon (Si), a binary mask blank having a light-shielding film made of a material containing tantalum (Ta), or a phase shift mask blank having a phase shift film made of a material containing silicon (Si) or a material containing a transition metal and silicon (Si).

As the material containing chromium (Cr), there can be cited chromium alone or a chromium-based material (CrO, CrN, CrC, CrON, CrCN, CrOC, CrOCN, or the like).

As the material containing tantalum (Ta), there can be cited tantalum alone, a compound of tantalum and another metal element (e.g. Hf, Zr, or the like), or a material containing tantalum and at least one element from nitrogen, oxygen, carbon, and boron, such as, specifically, a material containing TaN, TaO, TaC, TaB, TaON, TaCN, TaBN, TaCO, TaBO, TaBC, TaCON, TaBON, TaBCN, or TaBCON.

As the material containing silicon (Si), there can be cited a material containing silicon and at least one element from nitrogen, oxygen, and carbon. Specifically, a material containing silicon nitride, silicon oxide, silicon carbide, silicon oxynitride, silicon carboxide, or silicon carboxynitride is preferable.

As the material containing a transition metal and silicon (Si), there can be cited, other than a material containing a transition metal and silicon, a material containing a transition metal and silicon and further containing at least one element from nitrogen, oxygen, and carbon. Specifically, a material containing a transition metal silicide, a transition metal silicide nitride, a transition metal silicide oxide, a transition metal silicide carbide, a transition metal silicide oxynitride, a transition metal silicide carboxide, or a transition metal silicide carboxynitride is preferable. As the transition metal, use can be made of molybdenum, tantalum, tungsten, titanium, chromium, hafnium, nickel, vanadium, zirconium, ruthenium, rhodium, niobium, or the like. Among them, molybdenum is particularly preferable.

[Mask]

This invention also provides a reflective mask in which the absorber film of the reflective mask blank having the above-mentioned structure is patterned, and a mask in which the thin film of the mask blank having the above-mentioned structure is patterned.

Figure 10:
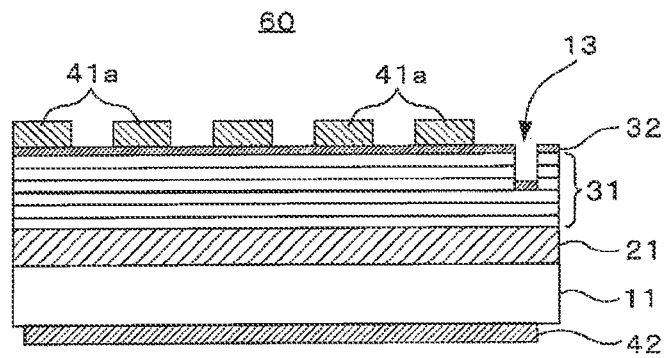
FIG. 10 is a cross-sectional view of a reflective mask according to this invention.

FIG. 10 shows a reflective mask 60 having an absorber film pattern 41a obtained by patterning the absorber film 41 of the reflective mask blank 40 of FIG. 8.

Figure 11:
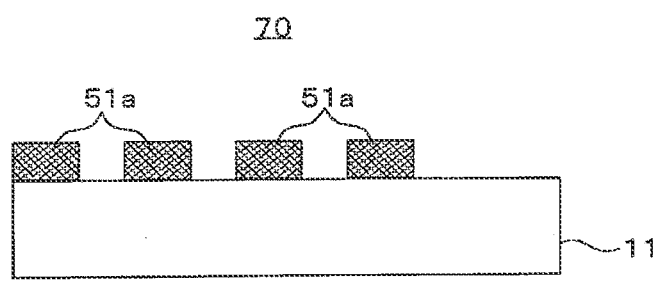
FIG. 11 is a cross-sectional view of a binary mask according to this invention.

FIG. 11 shows a binary mask 70 having a light-shielding film pattern 51a obtained by patterning the light-shielding film 51 of the binary mask blank 50 of FIG. 9.

As a method of patterning the thin film such as the absorber film or the light-shielding film, which is to be a transfer pattern, of the mask blank, the photolithography is the most suitable.

Although not illustrated, in the case of the phase shift mask blank having the phase shift film or the phase shift film and the light-shielding film on the mask blank glass substrate, a phase shift mask is obtained by patterning the thin film which is to be a transfer pattern.

EXAMPLES

Hereinbelow, the embodiments of this invention will be described in further detail with reference to Examples.

Example 1

A $SiO_2$—$TiO_2$-based glass substrate (size: about 152.4 mm×about 152.4 mm, thickness: about 6.35 mm) was prepared, wherein surfaces of the substrate were polished stepwise with cerium oxide abrasive particles and colloidal silica abrasive particles using a double-side polishing machine and then were surface-treated with low-concentration fluorosilicic acid. The surface roughness of the obtained glass substrate was 0.25 nm in root mean square roughness (RMS) (measured by an atomic force microscope, measurement region: 1 μm×1 μm).

The surface shape (surface form, flatness) of both front and back surfaces of the glass substrate was measured by a flatness measuring apparatus (UltraFlat manufactured by Tropel Corporation) (measurement region: 148 mm×148 mm). As a result, the flatness of the front and back surfaces of the glass substrate was about 290 nm.

Then, local surface machining was applied to the surfaces of the glass substrate, thereby adjusting the surface shape thereof.

The surface shape (surface form, flatness) and the surface roughness of the obtained glass substrate surfaces were measured. As a result, in a 142 mm×142 mm measurement region, the flatness of the front and back surfaces was 80 nm, i.e. 100 nm or less, and thus was satisfactory.

Then, using a B-doped Si target and using a mixed gas of Ar gas and He gas as a sputtering gas, DC magnetron sputtering was carried out to form a Si underlayer of 100 nm. Then, stress reduction treatment was carried out by applying thermal energy to the Si film.

Thereafter, in order to maintain the surface shape and to reduce the surface roughness, a surface of the Si underlayer was precision-polished using a single-side polishing machine.

The surface shape (surface form, flatness) and the surface roughness of the obtained Si underlayer surface were measured. As a result, in a 142 mm×142 mm measurement region, the flatness was 80 nm, i.e. 100 nm or less, and thus was satisfactory. Further, in a 1 μm×1 μm measurement region, the surface roughness was 0.08 nm in root mean square roughness RMS and thus was extremely excellent. Since the Si underlayer surface has an extremely high smoothness of 0.1 nm or less in RMS, background noise in a highly sensitive defect inspection apparatus is reduced, which is effective also in terms of suppressing false defect detection.

Further, in a 1 μm×1 μm measurement region, the maximum surface roughness (Rmax) was 0.60 nm and thus Rmax/RMS was 7.5. Accordingly, variation in surface roughness was satisfactorily small.

Then, using an ion-beam sputtering apparatus, given that a Si film (thickness: 4.2 nm) and a Mo film (thickness: 2.8 nm) formed one cycle, Si films and Mo films were laminated by 40 cycles to form a multilayer reflective film (total thickness: 280 nm) on the Si underlayer, thereby obtaining a multilayer reflective film formed substrate.

Then, fiducial marks having the following surface shape and concave cross-sectional shape were formed at predetermined portions of a surface of the multilayer reflective film. The fiducial marks were formed using a focused ion beam. In this event, conditions were set to an accelerating voltage of 50 kV and a beam current value of 20 pA.

In this Example, as each fiducial mark, a main mark and auxiliary marks were formed in the arrangement relationship shown in FIG. 2. The main mark 13a had a rectangular shape with a size of 5 μm×5 μm, wherein the depth was set to about 280 nm because all layers constituting the multilayer reflective film were removed. The auxiliary marks 13b and 13c each had a rectangular shape with a size of 1 μm×200 μm, wherein the depth was set to about 280 nm because all layers constituting the multilayer reflective film were removed.

Figure 12:
FIG. 12 is a photograph showing a cross-sectional shape of a fiducial mark formed in a multilayer reflective film.

The cross-sectional shape of the fiducial mark was observed by an atomic force microscope (AFM). As a result, as shown in FIG. 12, the inclination angle of a side wall was 85 degrees and the radius of curvature of a ridgeline portion between the surface of the multilayer reflective film and the side wall was about 250 nm, meaning that the cross-sectional shape was excellent.

It was confirmed by an electron beam writing apparatus or a mask blank inspection apparatus that the fiducial mark formed in the multilayer reflective film exhibited a contrast of as high as 0.025 and thus could be accurately detected and further that it could be detected with high reproducibility because variation in defect detection position was 83 nm, i.e. 100 nm or less.

Then, the surface of the multilayer reflective film was subjected to a defect inspection using a mask blank defect inspection apparatus (Teron 600 Series manufactured by KLA-Tencor Corporation). In this defect inspection, reference points were determined using the above-mentioned fiducial marks as references and convex and concave defect position information based on relative positions to the determined reference points and defect size information were obtained, thereby producing a defect map. There was obtained the multilayer reflective film formed substrate with defect information (defect map) in which the multilayer reflective film formed substrate and these defect position information and defect size information were correlated with each other. The reflectance of the surface of the multilayer reflective film of this multilayer reflective film formed substrate was evaluated by an EUV reflectometer. As a result, since variation in surface roughness of the underlayer was suppressed, the reflectance was 67%±0.2%, which was satisfactory.

Then, using a DC magnetron sputtering apparatus, a capping layer (thickness: 2.5 nm) made of RuNb and an absorber layer in the form of a laminate of a TaBN film (thickness: 56 nm) and a TaBO film (thickness: 14 nm) were formed on the multilayer reflective film and, further, a CrN conductive film (thickness: 20 nm) was formed on the back side, thereby obtaining an EUV reflective mask blank.

Then, the obtained EUV reflective mask blank was subjected to a defect inspection using a mask blank defect inspection apparatus (Teron 600 Series manufactured by KLA-Tencor Corporation). In the same manner as described above, convex and concave defect position information using the above-mentioned fiducial marks as references and defect size information were obtained, thereby obtaining the EUV reflective mask blank with defect information in which the EUV reflective mask blank and these defect position information and defect size information were correlated with each other.

Then, using this EUV reflective mask blank with defect information, an EUV reflective mask was manufactured.

First, a resist for electron beam writing was applied on the EUV reflective mask blank by spin coating and then baked, thereby forming a resist film.

Then, the defect information of the EUV reflective mask blank and pre-designed mask pattern data were collated with each other. Then, one of the following corrections was made, i.e. correction to mask pattern data having no influence on pattern transfer using an exposure apparatus, correction to mask pattern data added with correction pattern data so as to, for example, hide a defect under a pattern when judged to have an influence on the pattern transfer, and correction to mask pattern data capable of reducing the load of defect correction after the manufacture of a mask in the case of a defect not curable even by correction pattern data. Based on the corrected mask pattern data, a mask pattern was written on the resist film by an electron beam and then development was carried out, thereby forming a resist pattern. In this Example, since the relative positional relationship between the fiducial marks and defects could be managed with high accuracy, it was possible to accurately correct the mask pattern data.

Using the resist pattern as a mask, the TaBO film of the absorber layer was etched with a fluorine-based gas ($CF_4$ gas) while the TaBN film of the absorber layer was etched with a chlorine-based gas ($Cl_2$ gas), thereby forming an absorber layer pattern on the capping layer.

Then, the resist pattern remaining on the absorber layer pattern was removed by hot sulfuric acid, thereby obtaining an EUV reflective mask.

The obtained EUV reflective mask was inspected using a mask defect inspection apparatus (Teron 600 Series manufactured by KLA-Tencor Corporation). As a result, no convex defect was observed on the multilayer reflective film.

When the reflective mask thus obtained is set in an exposure apparatus to carry out pattern transfer onto a semiconductor substrate formed with a resist film, excellent pattern transfer can be carried out with no defect of a transfer pattern due to the reflective mask.

Example 2

A reflective mask blank was manufactured in the same manner as in Example 1 except that fiducial marks in Example 1 were not formed in a multilayer reflective film, but formed in an absorber film.

The cross-sectional shape of the fiducial mark was observed by an atomic force microscope (AFM). As a result, as in Example 1, the inclination angle of a side wall was 87 degrees and the radius of curvature of a ridgeline portion between a surface of the absorber film and the side wall was about 120 nm, meaning that the cross-sectional shape was excellent.

It was confirmed by an electron beam writing apparatus or a mask blank defect inspection apparatus that the fiducial mark formed in the absorber film exhibited a contrast of as high as 0.020 and thus could be accurately detected and further that it could be detected with high reproducibility because variation in defect detection position was 81 nm.

In this Example, a surface of the multilayer reflective film of a multilayer reflective film formed substrate, in which the multilayer reflective film was formed on a substrate, was subjected to a defect inspection by a mask blank defect inspection apparatus (Teron 600 Series manufactured by KLA-Tencor Corporation) using the center of a main surface of the substrate as a reference. Then, with respect to the reflective mask blank formed with the absorber film, convex and concave defect position information using the fiducial marks as references and defect size information were obtained using the same mask blank defect inspection apparatus as described above. Finally, collation was made based on a plurality of defects which were consistent between defect information of the multilayer reflective film formed substrate and defect information of the reflective mask blank, thereby obtaining the EUV reflective mask blank with defect information in which the reflective mask blank and these defect position information and defect size information were correlated with each other.

In the same manner as in Example 1, an EUV reflective mask was manufactured. The obtained EUV reflective mask was inspected using a mask defect inspection apparatus (Teron 600 Series manufactured by KLA-Tencor Corporation). As a result, no convex defect was observed on the multilayer reflective film.

When the reflective mask thus obtained is set in an exposure apparatus to carry out pattern transfer onto a semiconductor substrate formed with a resist film, excellent pattern transfer can be carried out with no defect of a transfer pattern due to the reflective mask.

Example 3

A synthetic quartz substrate (size: about 152.4 mm×about 152.4 mm, thickness: about 6.35 mm) was prepared, wherein surfaces of the substrate were polished stepwise with cerium oxide abrasive particles and colloidal silica abrasive particles using a double-side polishing machine and then were surface-treated with low-concentration fluorosilicic acid. The surface roughness of the obtained glass substrate was 0.2 nm in root mean square roughness (RMS). The flatness of the front and back surfaces of the glass substrate was about 290 nm.

Then, on the glass substrate, a light-shielding film in the form of a laminate of a TaN film and a TaO film was formed in the following manner.

Using a tantalum (Ta) target as a target, reactive sputtering (DC sputtering) was carried out by setting the power of a DC power supply to 1.5 kW in a mixed gas atmosphere of xenon (Xe) and nitrogen ($N_2$) (gas pressure 0.076 Pa, gas flow rate ratio Xe:$N_2$=11 sccm:15 sccm), thereby forming a TaN film having a thickness of 44.9 nm. Subsequently, using a Ta target, reactive sputtering (DC sputtering) was carried out by setting the power of a DC power supply to 0.7 kW in a mixed gas atmosphere of argon (Ar) and oxygen ($O_2$) (gas pressure 0.3 Pa, gas flow rate ratio Ar:$O_2$=58 sccm:32.5 sccm), thereby forming a TaO film having a thickness of 13 nm. In this manner, a light-shielding film for ArF excimer laser (wavelength 193 nm) in the form of the laminate of the TaN film and the TaO film was formed, thereby manufacturing a binary mask blank. The light-shielding film had an optical density of 3.0 for ArF excimer laser and a front-surface reflectance of 19.5%.

Then, fiducial marks which were the same as those in Example 1 were formed at predetermined portions of a surface of the light-shielding film. The fiducial marks were formed using a focused ion beam. In this event, conditions were set to an accelerating voltage of 50 kV and a beam current value of 20 pA.

The cross-sectional shape of the fiducial mark was observed by an atomic force microscope (AFM). As a result, as in Example 1, the inclination angle of a side wall was 83 degrees and the radius of curvature of a ridgeline portion between the surface of the light-shielding film and the side wall was about 300 nm, meaning that the cross-sectional shape was excellent.

It was confirmed by an electron beam writing apparatus or a mask blank inspection apparatus that the fiducial mark formed in the light-shielding film exhibited a contrast of as high as 0.02 and thus could be accurately detected and further that it could be detected with high reproducibility because variation in defect detection position was 80 nm.

The obtained binary mask blank was subjected to a defect inspection using a mask blank defect inspection apparatus (Teron 600 Series manufactured by KLA-Tencor Corporation). Convex and concave defect position information using the fiducial marks formed in the light-shielding film as references and defect size information were obtained, thereby obtaining the binary mask blank with defect information in which the binary mask blank and these defect position information and defect size information were correlated with each other.

Then, using this binary mask blank with defect information, a binary mask was manufactured.

First, a resist for electron beam writing was applied on the binary mask blank by spin coating and then baked, thereby forming a resist film.

Then, as in Example 1, the defect information of the binary mask blank and pre-designed mask pattern data were collated with each other. Then, one of the following corrections was made, i.e. correction to mask pattern data having no influence on pattern transfer using an exposure apparatus, correction to mask pattern data added with correction pattern data when judged to have an influence on the pattern transfer, and correction to mask pattern data capable of reducing the load of defect correction after the manufacture of a mask in the case of a defect not curable even by correction pattern data. Based on the corrected mask pattern data, a mask pattern was written on the resist film by an electron beam and then development was carried out, thereby forming a resist pattern. Also in this Example, since the relative positional relationship between the fiducial marks and defects could be managed with high accuracy, it was possible to accurately correct the mask pattern data.

Using the resist pattern as a mask, the TaO film was etched with a fluorine-based gas ($CF_4$ gas) while the TaN film was etched with a chlorine-based gas ($Cl_2$ gas), thereby forming a light-shielding film pattern.

Then, the resist pattern remaining on the light-shielding film pattern was removed by hot sulfuric acid, thereby obtaining a binary mask.

The obtained binary mask was inspected using a mask defect inspection apparatus (Teron 600 Series manufactured by KLA-Tencor Corporation). As a result, no convex defect was observed on the glass substrate.

When the binary mask thus obtained was set in an exposure apparatus to carry out pattern transfer onto a semiconductor substrate formed with a resist film, excellent pattern transfer was carried out with no defect of a transfer pattern.

Comparative Example

A multilayer reflective film formed substrate formed with fiducial marks, a reflective mask blank, and a reflective mask were manufactured in order in the same manner as in Example 1 except that the size of a main mark of each fiducial mark in Example 1 was set to 100 μm×100 μm.

The obtained EUV reflective mask was inspected using a mask defect inspection apparatus (Teron 600 Series manufactured by KLA-Tencor Corporation). As a result, several tens of convex defects were observed on a multilayer reflective film.

As a result of examining the reason why several tens of convex defects were observed on the multilayer reflective film, it was found out that the detection reproducibility of the fiducial marks formed in this Comparative Example was poor (particularly in a defect inspection apparatus) so that mask pattern data could not be accurately corrected/modified based on defect information.

Example 4

Fiducial marks having a concave cross-sectional shape were formed at predetermined portions of a surface of a multilayer reflective film of a multilayer reflective film formed substrate in Example 1. The fiducial marks were formed using FIB (focused ion beam) as in Example 1. In this event, conditions were set to an accelerating voltage of 50 kV and a beam current value of 20 pA.

In this Example, edge coordinates of eight portions of four sides of the substrate were confirmed and then tilt correction was carried out to set the origin at an arbitrary corner of the substrate. Then, the fiducial mark was formed by FIB at a predetermined position from the origin which was set on an edge basis as described above. Specifically, the fiducial mark was formed at a position distanced by 8000 μm, 8000 μm from respective edges of end faces both adjacent to the origin which was set at the arbitrary corner of the substrate on the edge basis. The fiducial marks were formed in the same manner at four portions in total in the substrate plane.

As each fiducial mark, a main mark and auxiliary marks were formed in the arrangement relationship shown at (a) in FIG. 16. The main mark 13a had a rectangular shape with a size of 5 μm×5 μm, wherein the depth was set to about 280 nm because all layers constituting the multilayer reflective film were removed. The auxiliary marks 13b and 13c each had a rectangular shape with a size of 1 μm×120 μm, wherein the depth was set to about 280 nm because all layers constituting the multilayer reflective film were removed.

It was confirmed by an electron beam writing apparatus or a mask blank inspection apparatus that the fiducial mark formed in the multilayer reflective film exhibited as high a contrast as that in Example 1 and could be accurately detected in a short time using formation position information of the fiducial mark (fiducial mark formation coordinates).

Further, it was possible to shorten the processing time of the fiducial mark by about 30 percent compared to Example 1.

Example 5

Fiducial marks were formed on a multilayer reflective film formed substrate in the same manner as in Example 3 except that each fiducial mark consisted of only a main mark having a rectangular shape with a size of 5 μm×5 μm.

It was confirmed by an electron beam writing apparatus or a mask blank inspection apparatus that the fiducial mark formed on the multilayer reflective film formed substrate exhibited as high a contrast as that in Example 1 and could be accurately detected in a short time using formation position information of the fiducial mark (fiducial mark formation coordinates).

Further, it was possible to shorten the processing time of the fiducial mark by about 60 percent compared to Example 1.

Example 6

As fiducial marks, only main marks each having a rectangular shape with a size of 5 μm×5 μm were formed at arbitrary positions. Specifically, the fiducial marks each having a concave cross-sectional shape were formed at predetermined portions of a surface of a multilayer reflective film of a multilayer reflective film formed substrate in Example 1. The fiducial marks were formed using FIB (focused ion beam) as in Example 1. In this event, conditions were set to an accelerating voltage of 50 kV and a beam current value of 20 pA. Thereafter, center coordinates of the fiducial marks were measured by a highly accurate pattern position measuring apparatus (LMS-IPRO4 manufactured by KLA-Tencor Corporation). As a result, it was confirmed that the fiducial marks were respectively formed at positions of (8022 μm, 8011 μm), (7999 μm, 144005 μm), (144004 μm, 8017 μm), and (143982 μm, 144010 μm) with respect to the origin at an upper-left corner of the substrate.

It was confirmed by an electron beam writing apparatus or a mask blank inspection apparatus that the fiducial mark formed on the multilayer reflective film formed substrate exhibited as high a contrast as that in Example 1 and could be accurately detected in a short time using formation position information of the fiducial mark (fiducial mark formation coordinates).

In each of the above-mentioned Examples, the description has been given of the example in which the fiducial mark was formed by a focused ion beam, but not limited thereto. As also described before, the fiducial mark can be formed by photolithography, recess formation by laser light or the like, machining trace by scanning a diamond stylus, indention by a micro-indenter, stamping by an imprint method, or the like.

In the above-mentioned Examples, the description has been given of the example in which the underlayer was formed in each of the multilayer reflective film formed substrate and the reflective mask blank, but not limited thereto. A multilayer reflective film formed substrate or a reflective mask blank formed with no underlayer may also be used.

DESCRIPTION OF SYMBOLS 11 glass substrate
12 rough alignment mark
13 fiducial mark (fine mark)
13a main mark
13b, 13c auxiliary mark
21 underlayer
30 multilayer reflective film formed substrate
31 multilayer reflective film
32 protective layer
40 reflective mask blank
41 absorber film
50 binary mask blank
51 light-shielding film
60 reflective mask
70 binary mask

The invention claimed is:
1. A multilayer reflective film formed substrate, comprising:
 a substrate;
 a multilayer reflective film which is formed on the substrate and which reflects EUV light; and a fiducial mark which serves as a reference for a defect position in defect information;

wherein the fiducial mark comprises a main mark for determining a reference point for the defect position, and wherein the main mark has a point-symmetrical shape and has a portion with a width of 200 nm or more and 10 µm or less with respect to a scanning direction of an electron beam or defect inspection light.

2. The multilayer reflective film formed substrate according to claim 1, wherein the main mark has a polygonal shape having at least two pairs of sides each perpendicular to and parallel to scanning directions of the electron beam or the defect inspection light.

3. The multilayer reflective film formed substrate according to claim 1, wherein the multilayer reflective film is formed with the fiducial mark.

4. A reflective mask blank, wherein an absorber film for absorbing the EUV light is formed on the multilayer reflective film of the multilayer reflective film formed substrate according to claim 1.

5. A method of manufacturing the multilayer reflective film formed substrate according to claim 1, comprising:

forming the fiducial mark at a predetermined position from an origin which was set based on edge coordinates of the substrate; and correlating the multilayer reflective film formed substrate comprising the fiducial mark and formation position information of the fiducial mark with each other.

6. The multilayer reflective film formed substrate manufacturing method according to claim 5, further comprising:

adding defect information based on the fiducial mark to the formation position information of the fiducial mark.

7. A reflective mask blank manufacturing method, comprising:

correlating a reflective mask blank having an absorber film for absorbing EUV light on the multilayer reflective film of the multilayer reflective film formed substrate comprising the fiducial mark according claim 5 and the formation position information of the fiducial mark with each other.

8. A method of manufacturing the multilayer reflective film formed substrate according to any of claim 1, comprising:

specifying, after forming the fiducial mark, a formation position of the fiducial mark by a coordinate measuring apparatus; and correlating the multilayer reflective film formed substrate comprising the fiducial mark and formation position information of the fiducial mark with each other.

9. A multilayer reflective film formed substrate, comprising:

a substrate;

a multilayer reflective film which is formed on the substrate and which reflects EUV light; and a fiducial mark which serves as a reference for a defect position in defect information;

wherein the fiducial mark comprises a main mark for determining a reference point for the defect position and an auxiliary mark arranged around the main mark, and wherein the main mark has a point-symmetrical shape and has a portion with a width of 200 nm or more and 10 µm or less with respect to a scanning direction of an electron beam or defect inspection light.

10. The multilayer reflective film formed substrate according to claim 9, wherein the auxiliary mark has a rectangular shape with long sides perpendicular to and short sides parallel to the scanning direction of the electron beam or the defect inspection light.

11. A reflective mask blank, comprising:

a substrate;

a multilayer reflective film which formed on the substrate and which reflects EUV light;

an absorber film which is formed on the multilayer reflective film and which absorbs the EUV light; and a fiducial mark which serves as a reference for a defect position in defect information;

wherein the fiducial mark comprises a main mark for determining a reference point for the defect position, and wherein the main mark has a point-symmetrical shape and has a portion with a width of 200 nm or more and 10 µm or less with respect to a scanning direction of an electron beam or defect inspection light.

12. The reflective mask blank according to claim 11, wherein the absorber film is formed with the fiducial mark.

13. The reflective mask blank according to claim 11, wherein the fiducial mark comprises the main mark and an auxiliary mark arranged around the main mark.

14. The reflective mask blank according to claim 13, wherein the auxiliary mark has a rectangular shape with long sides perpendicular to and short sides parallel to the scanning direction of the electron beam or the defect inspection light.

15. The reflective mask blank according to claim 11, wherein the main mark has a polygonal shape having at least two pairs of sides each perpendicular to and parallel to scanning directions of the electron beam or the defect inspection light.

16. A reflective mask, wherein the absorber film of the reflective mask blank according to claim 11 is patterned.

17. A method of manufacturing the reflective mask blank according to claim 11, comprising:

forming the fiducial mark at a predetermined position from an origin which was set based on edge coordinates of the substrate; and correlating the reflective mask blank comprising the fiducial mark and formation position information of the fiducial mark with each other.

18. A method of manufacturing the reflective mask blank according to claim 11, comprising:

specifying, after forming the fiducial mark, a formation position of the fiducial mark by a coordinate measuring apparatus; and correlating the reflective mask blank comprising the fiducial mark and formation position information of the fiducial mark with each other.

19. A mask blank, comprising:

a substrate;

a thin film which is formed on the substrate and which becomes a transfer pattern; and a fiducial mark which serves as a reference for a defect position in defect information;

wherein the fiducial mark comprises a main mark for determining a reference point for the defect position, and wherein the main mark has a point-symmetrical shape and has a portion with a width of 200 nm or more and 10 µm or less with respect to a scanning direction of an electron beam or defect inspection light.

20. A mask, wherein the thin film of the mask blank according to claim 19 is patterned.

21. A method of manufacturing the mask blank according to claim 19, comprising:

forming the fiducial mark at a predetermined position from an origin which was set based on edge coordinates of the substrate; and correlating the mask blank comprising the fiducial mark and formation position information of the fiducial mark with each other.

22. The mask blank manufacturing method according to claim 21, further comprising:

adding defect information based on the fiducial mark to the formation position information of the fiducial mark.

23. A method of manufacturing the mask blank according to claim 19, comprising:

specifying, after forming the fiducial mark, a formation position of the fiducial mark by a coordinate measuring apparatus; and correlating the mask blank comprising the fiducial mark and formation position information of the fiducial mark with each other.

24. A mask blank, comprising:

a substrate;

a thin film which is formed on the substrate and which becomes a transfer pattern; and a fiducial mark which serves as a reference for a defect position in defect information;

wherein the fiducial mark comprises a main mark for determining a reference point for the defect position and an auxiliary mark arranged around the main mark, and wherein the main mark has a point-symmetrical shape and has a portion with a width of 200 nm or more and 10 µm or less with respect to a scanning direction of an electron beam or defect inspection light.

* * * * *